United States Patent
Sawada et al.

(10) Patent No.: US 11,018,171 B2
(45) Date of Patent: May 25, 2021

(54) TRANSISTOR AND MANUFACTURING METHOD

(71) Applicant: SONY SEMICONDUCTOR SOLUTIONS CORPORATION, Kanagawa (JP)

(72) Inventors: Ken Sawada, Kanagawa (JP); Akiko Honjo, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days.

(21) Appl. No.: 16/480,741

(22) PCT Filed: Jan. 19, 2018

(86) PCT No.: PCT/JP2018/001587
§ 371 (c)(1),
(2) Date: Jul. 25, 2019

(87) PCT Pub. No.: WO2018/142970
PCT Pub. Date: Aug. 9, 2018

(65) Prior Publication Data
US 2019/0386047 A1    Dec. 19, 2019

(30) Foreign Application Priority Data

Feb. 3, 2017  (JP) ............................. JP2017-018161
Oct. 31, 2017 (JP) ................................. 2017-210012

(51) Int. Cl.
*H01L 29/08* (2006.01)
*H01L 27/146* (2006.01)
(Continued)

(52) U.S. Cl.
CPC .. *H01L 27/14616* (2013.01); *H01L 27/14645* (2013.01); *H01L 27/14689* (2013.01);
(Continued)

(58) Field of Classification Search
CPC ........... H01L 29/66659; H01L 29/7835; H01L 29/78624; H01L 29/0873; H01L 29/0878;
(Continued)

(56) References Cited

U.S. PATENT DOCUMENTS

| 4,771,012 A | * | 9/1988 | Yabu | ........................ H01L 29/78 438/286 |
| 4,992,387 A | * | 2/1991 | Tamura | ............... H01L 21/2815 257/E21.454 |

(Continued)

FOREIGN PATENT DOCUMENTS

| JP | H07-321320 | 12/1995 |
| JP | H08-186253 | 7/1996 |

(Continued)

OTHER PUBLICATIONS

International Search Report prepared by the Japan Patent Office dated Apr. 5, 2018, for International Application No. PCT/JP2018/001587.

*Primary Examiner* — Maliheh Malek
(74) *Attorney, Agent, or Firm* — Sheridan Ross P.C.

(57) ABSTRACT

The present technology relates to a transistor and a manufacturing method that make it possible to reduce noise. The transistor includes a gate electrode, a source region, and a drain region. The gate electrode is formed on a semiconductor substrate. The source region is formed on a surface of the semiconductor substrate and extended from the gate electrode. The drain region is positioned to oppose the source region and formed on the surface of the semiconductor substrate without being brought into contact with the gate electrode. The source region and the drain region are asymmetrical. The drain region is formed at a position deeper than the source region. At a gate end of the gate electrode, the drain region is formed at a distance from the (Continued)

surface of the semiconductor substrate. The present technology is applicable, for example, to an amplifying transistor.

18 Claims, 20 Drawing Sheets

(51) Int. Cl.
*H01L 29/78* (2006.01)
*H01L 29/66* (2006.01)
*H01L 29/786* (2006.01)

(52) U.S. Cl.
CPC ...... *H01L 29/0882* (2013.01); *H01L 29/0886* (2013.01); *H01L 29/7835* (2013.01); *H01L 29/66659* (2013.01); *H01L 29/78624* (2013.01)

(58) Field of Classification Search
CPC ............. H01L 29/0882; H01L 29/0886; H01L 29/0843; H01L 29/41725; H01L 27/14616
See application file for complete search history.

(56) References Cited

U.S. PATENT DOCUMENTS

| | | | | |
|---|---|---|---|---|
| 5,036,017 | A * | 7/1991 | Noda | H01L 29/0891 438/179 |
| 5,214,303 | A * | 5/1993 | Aoki | G11C 17/12 257/387 |
| 5,364,807 | A * | 11/1994 | Hwang | H01L 29/0847 438/286 |
| RE35,036 | E * | 9/1995 | Yabu | H01L 21/26586 438/282 |
| 5,518,942 | A * | 5/1996 | Shrivastava | H01L 27/11517 257/E21.68 |
| 5,629,220 | A | 5/1997 | Yang | |
| 5,638,327 | A * | 6/1997 | Dallabora | G11C 16/0416 257/E27.103 |
| 5,648,286 | A * | 7/1997 | Gardner | H01L 29/66659 257/E21.427 |
| 5,650,340 | A * | 7/1997 | Burr | H01L 29/1045 257/E21.427 |
| 5,675,168 | A | 10/1997 | Yamashita et al. | |
| 5,677,224 | A * | 10/1997 | Kadosh | H01L 21/823814 257/274 |
| 5,741,736 | A * | 4/1998 | Orlowski | H01L 21/28105 438/286 |
| 5,780,341 | A * | 7/1998 | Ogura | H01L 27/115 438/259 |
| 5,786,620 | A * | 7/1998 | Richards, Jr. | H01L 21/26586 257/408 |
| 5,834,810 | A * | 11/1998 | Schunke | H01L 29/66636 257/336 |
| 6,027,964 | A * | 2/2000 | Gardner | H01L 21/266 257/350 |
| 6,281,531 | B1 * | 8/2001 | Kamashita | H01L 27/14609 257/258 |
| 6,388,298 | B1 | 5/2002 | Gardner et al. | |
| 6,445,016 | B1 * | 9/2002 | An | H01L 29/66742 257/192 |
| 6,657,223 | B1 * | 12/2003 | Wang | H01L 29/1054 257/19 |
| 6,949,423 | B1 * | 9/2005 | Ma | G11C 17/16 438/201 |
| 7,067,381 | B1 * | 6/2006 | Thurgate | H01L 21/26586 257/E21.345 |
| 7,067,878 | B2 * | 6/2006 | Ohyanagi | H01L 21/823412 257/336 |
| 7,393,752 | B2 * | 7/2008 | Yang | H01L 29/7835 257/E21.345 |
| 7,485,524 | B2 * | 2/2009 | Luo | H01L 29/66636 257/E21.431 |
| 7,776,700 | B2 * | 8/2010 | Yang | H01L 29/66659 438/286 |
| 7,964,465 | B2 * | 6/2011 | Anderson | H01L 29/66795 257/E21.431 |
| 8,138,050 | B2 * | 3/2012 | Papageorgiou | H01L 29/66659 438/286 |
| 8,445,940 | B2 * | 5/2013 | Tsai | H01L 29/7848 257/192 |
| 8,497,180 | B2 * | 7/2013 | Javorka | H01L 29/7848 438/305 |
| 8,587,075 | B2 * | 11/2013 | Bhuwalka | H01L 29/7391 257/402 |
| 8,735,255 | B2 * | 5/2014 | Hsiao | H01L 29/6653 438/300 |
| 9,773,728 | B1 * | 9/2017 | Juengling | H01L 23/528 |
| 10,178,332 | B2 * | 1/2019 | Hatano | H04N 5/23209 |
| 10,229,945 | B2 * | 3/2019 | Soda | H01L 27/14614 |
| 10,236,375 | B2 * | 3/2019 | Huang | H01L 29/0653 |
| 10,490,652 | B2 * | 11/2019 | Gan | G11C 11/419 |
| 10,616,515 | B2 * | 4/2020 | Hatano | H01L 27/14645 |
| 10,680,099 | B2 * | 6/2020 | Li | H01L 29/6659 |
| 2003/0045082 | A1 * | 3/2003 | Eldridge | H01L 29/51 438/593 |
| 2003/0047781 | A1 * | 3/2003 | Lee | H01L 29/66772 257/347 |
| 2003/0048666 | A1 * | 3/2003 | Eldridge | H01L 29/7885 365/185.28 |
| 2004/0173859 | A1 * | 9/2004 | Hao | H01L 29/66659 257/408 |
| 2005/0275037 | A1 * | 12/2005 | Chung | H01L 29/0649 257/374 |
| 2006/0043498 | A1 * | 3/2006 | Orlowski | H01L 29/66636 257/396 |
| 2006/0049467 | A1 * | 3/2006 | Lim | H01L 29/7834 257/383 |
| 2006/0071254 | A1 * | 4/2006 | Rhodes | H04N 5/35527 257/292 |
| 2006/0081930 | A1 * | 4/2006 | Maegawa | H01L 29/78624 257/347 |
| 2007/0010052 | A1 * | 1/2007 | Huang | H01L 21/823807 438/199 |
| 2007/0080397 | A1 * | 4/2007 | Manabe | H01L 21/28114 257/335 |
| 2008/0054339 | A1 * | 3/2008 | Choi | H01L 27/115 257/316 |
| 2009/0020806 | A1 * | 1/2009 | Anderson | H01L 29/66659 257/327 |
| 2009/0124056 | A1 * | 5/2009 | Chen | H01L 29/66545 438/278 |
| 2009/0166735 | A1 * | 7/2009 | Iwasa | H01L 21/823475 257/337 |
| 2009/0263949 | A1 * | 10/2009 | Anderson | H01L 29/66795 438/285 |
| 2010/0012975 | A1 * | 1/2010 | Pal | H01L 29/66659 257/190 |
| 2010/0038713 | A1 * | 2/2010 | Majhi | H01L 29/66545 257/344 |
| 2010/0244128 | A1 * | 9/2010 | Bulucea | H01L 29/1045 257/335 |
| 2010/0244147 | A1 * | 9/2010 | Yang | H01L 21/26513 257/408 |
| 2011/0108918 | A1 * | 5/2011 | Yin | H01L 29/66636 257/347 |
| 2011/0127607 | A1 * | 6/2011 | Cai | H01L 29/7835 257/339 |
| 2011/0180872 | A1 * | 7/2011 | Yin | H01L 29/66659 257/347 |
| 2011/0210381 | A1 * | 9/2011 | Ha | H01L 27/14689 257/291 |
| 2011/0215423 | A1 * | 9/2011 | Iwamatsu | H01L 29/7834 257/408 |
| 2012/0051164 | A1 * | 3/2012 | Son | H01L 29/1083 365/200 |
| 2012/0139046 | A1 * | 6/2012 | Tan | H01L 29/78618 257/347 |

(56) References Cited

U.S. PATENT DOCUMENTS

| | | | | |
|---|---|---|---|---|
| 2012/0161230 A1* | 6/2012 | Satoh | H01L 29/66545 | 257/335 |
| 2012/0273881 A1* | 11/2012 | French | H01L 29/7835 | 257/339 |
| 2012/0280323 A1* | 11/2012 | Chuang | H01L 29/42372 | 257/368 |
| 2013/0032864 A1* | 2/2013 | Javorka | H01L 29/045 | 257/288 |
| 2013/0032881 A1* | 2/2013 | Piao | H01L 29/66659 | 257/343 |
| 2013/0140625 A1* | 6/2013 | Piao | H01L 29/78 | 257/327 |
| 2013/0200445 A1* | 8/2013 | Lee | H01L 29/41775 | 257/288 |
| 2014/0175545 A1* | 6/2014 | Kao | H01L 29/7816 | 257/339 |
| 2014/0264581 A1* | 9/2014 | Chan | H01L 29/7835 | 257/339 |
| 2015/0048439 A1* | 2/2015 | Shum | G11C 16/0425 | 257/326 |
| 2015/0200168 A1* | 7/2015 | Lee | H01L 29/7816 | 257/173 |
| 2015/0236150 A1* | 8/2015 | Chen | H01L 21/761 | 327/109 |
| 2016/0204113 A1* | 7/2016 | Zhang | H01L 27/1104 | 257/369 |
| 2016/0254056 A1* | 9/2016 | Li | G11C 16/0466 | 365/185.18 |
| 2016/0315146 A1* | 10/2016 | Jung | H01L 21/823418 | |
| 2016/0343853 A1* | 11/2016 | Toh | H01L 29/78612 | |
| 2016/0359016 A1* | 12/2016 | Imthurn | H01L 21/283 | |
| 2016/0380075 A1* | 12/2016 | Chung | H01L 29/7855 | 257/190 |
| 2017/0062420 A1* | 3/2017 | You | H01L 29/42376 | |
| 2017/0194439 A1* | 7/2017 | Wu | H01L 29/7835 | |
| 2017/0243649 A1* | 8/2017 | Horiuchi | H01L 29/66833 | |
| 2017/0330891 A1* | 11/2017 | Kawashima | H01L 29/66568 | |
| 2018/0012967 A1* | 1/2018 | Kang | H01L 29/0653 | |
| 2018/0026093 A1* | 1/2018 | Chen | H01L 29/42368 | 257/344 |
| 2018/0269319 A1* | 9/2018 | Yu | H01L 29/66659 | |
| 2018/0286976 A1* | 10/2018 | Qi | H01L 29/063 | |
| 2018/0337276 A1* | 11/2018 | Huang | H01L 29/0649 | |
| 2019/0035902 A1* | 1/2019 | Honjo | H01L 27/146 | |
| 2019/0035930 A1* | 1/2019 | Chen | H01L 29/66659 | |
| 2019/0043986 A1* | 2/2019 | Jang | H01L 29/1045 | |
| 2019/0096871 A1* | 3/2019 | Tatsumi | H01L 27/0255 | |
| 2019/0123155 A1* | 4/2019 | Cai | H01L 29/063 | |
| 2019/0206989 A1* | 7/2019 | Siddiqui | H01L 29/66681 | |
| 2019/0288066 A1* | 9/2019 | Lee | H01L 29/0847 | |
| 2019/0305129 A1* | 10/2019 | Uda | H01L 29/7825 | |

FOREIGN PATENT DOCUMENTS

| | | |
|---|---|---|
| JP | H10-116986 | 5/1998 |
| JP | 2010-021221 | 1/2010 |
| JP | 2010-056301 | 3/2010 |
| JP | 2011-211117 | 10/2011 |

\* cited by examiner

TRANSISTOR AND MANUFACTURING METHOD

CROSS REFERENCE TO RELATED APPLICATIONS

This application is a national stage application under 35 U.S.C. 371 and claims the benefit of PCT Application No. PCT/JP2018/001587 having an international filing date of 19 Jan. 2018, which designated the United States, which PCT application claimed the benefit of Japanese Patent Application Nos. 2017-018161 filed 3 Feb. 2017 and 2017-210012 filed 31 Oct. 2017, the entire disclosures of each of which are incorporated herein by reference.

TECHNICAL FIELD

The present technology relates to a transistor and a manufacturing method. For example, the present technology relates to a transistor and a manufacturing method that reduce the level of noise without sacrificing gate control performance.

BACKGROUND ART

A buried-channel structure is proposed as a noise countermeasure for a pixel signal amplifying transistor that is used as one of the transistors included in an imaging apparatus (refer to PTL 1).

It is expected that the buried-channel structure will reduce the influence of an interface or a surface by controlling a channel path so as to prevent noise from being generated by the exchange of a carrier with a defect (trap) at an interface between a channel and a gate oxide film or a defect (trap) on a Si (silicon) surface.

Proposed as a channel path control structure are, for example, a structure for making a source/drain implantation asymmetrical (PTL 2), a structure for inserting a high-resistance region into a source side (PTL 3 to PTL 5), a structure for inserting a high-resistance region into a source side and changing the depth of a source/drain region (PTL 6), a structure for forming a high-resistance region on a drain side (PTL 7), a structure for making a drain region deeper than a source region (PTL 8), and other structures.

CITATION LIST

Patent Literature

[PTL 1]
Japanese Patent Laid-open No. 2010-192917
[PTL 2]
Japanese Patent Laid-open No. 2012-164699
[PTL 3]
Japanese Patent Laid-open No. Hei 7-321320
[PTL 4]
Japanese Patent Laid-open. No. 2013-247347
[PTL 5]
Japanese Patent Laid-open No. 2016-111251
[PTL 6]
Japanese Patent Laid-open No. 2008-166607
[PTL 7]
Japanese Patent Laid-open No. 2011-181617
[PTL 8]
Japanese Patent Laid-open No. 2014-036082

SUMMARY

Technical Problem

However, when a buried-channel structure is employed for an amplifying transistor, it is probable that driving performance may deteriorate due to reduced gate controllability as disclosed in PTL 1.

Further, when a buried-channel structure proposed by PTL 1 to PTL 8 is employed, for example, for an amplifying transistor or other transistor that is represented by a transistor operated under source follower bias conditions in an analog circuit by flowing a current having a predetermined or higher current value (operated in a saturation region), substrate bias conditions are determined by an operating current value. Therefore, the electron density distribution of a channel may be eventually formed in the vicinity of an interface to reduce the effect of burying.

Moreover, the influence of RTN (random telegraph noise) has become significant in recent years due to the miniaturization and low-current operation of elements. Therefore, it is additionally desired that the RTN be reduced.

The present technology has been made in view of the above circumstances, and makes it possible to reduce RTN and other noise without deteriorating the performance of a transistor.

Solution to Problem

According to an aspect of the present technology, there is provided a transistor that includes: a gate electrode that is formed on a semiconductor substrate; a source region that is formed on a surface of the semiconductor substrate and extended from the gate electrode; and a drain region that is positioned to oppose the source region and formed on the surface of the semiconductor substrate without being brought into contact with the gate electrode.

According to an aspect of the present technology, there is provided a manufacturing method for manufacturing a transistor that includes: a gate electrode that is formed on a semiconductor substrate; a source region that is formed on a surface of the semiconductor substrate and extended from the gate electrode; and a drain region that is positioned to oppose the source region and formed on the surface of the semiconductor substrate without being brought into contact with the gate electrode.

The transistor according to an aspect of the present technology includes a gate electrode, a source region, and a drain region. The gate electrode is formed on a semiconductor substrate. The source region is formed on a surface of the semiconductor substrate and extended from the gate electrode. The drain region is positioned to oppose the source region and formed on the surface of the semiconductor substrate without being brought into contact with the gate electrode.

The manufacturing method according to an aspect of the present technology manufactures the transistor.

Advantageous Effect of Invention

According to an aspect of the present technology, RTN and other noise can be reduced without deteriorating the performance of a transistor.

It should be noted that the advantages described above are merely illustrative and not restrictive. The present technology may provide any advantages described in this document.

BRIEF DESCRIPTION OF DRAWINGS

Figure 18:
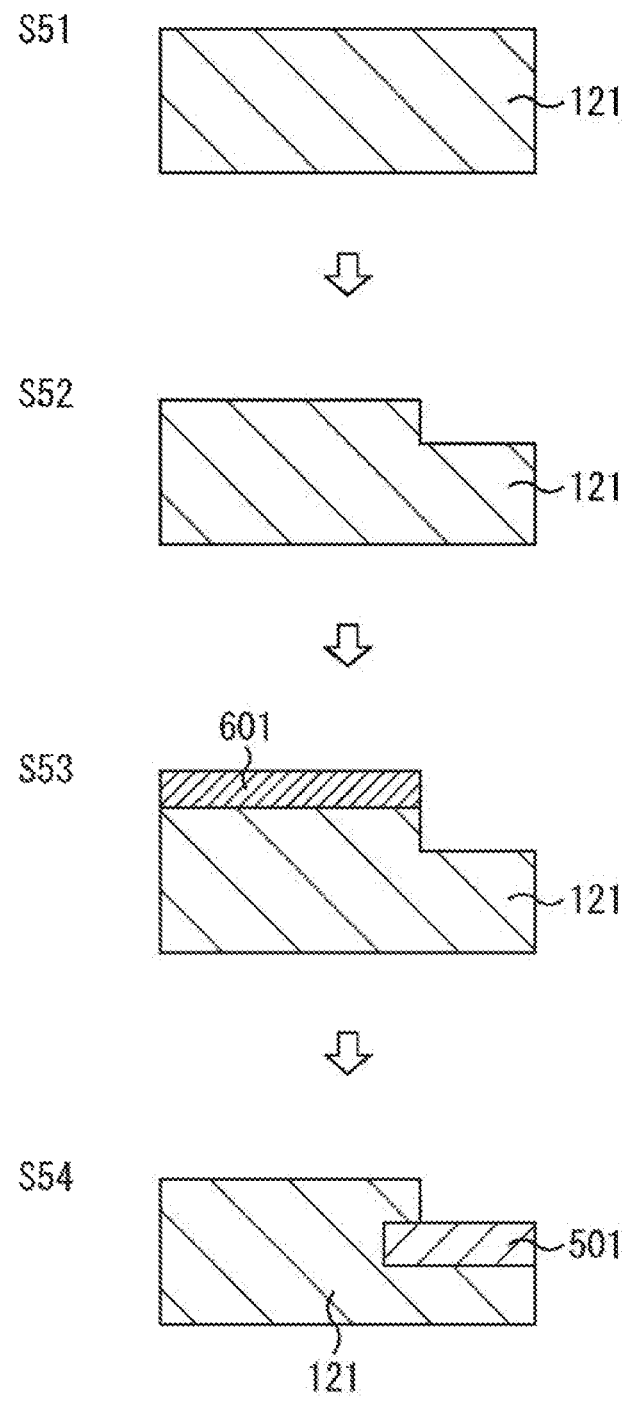

FIG. 18 is a diagram illustrating the manufacture of the transistor.

DESCRIPTION OF EMBODIMENTS

Modes for implementing the present technology (hereinafter referred to as embodiments) will now be described.

<Cross-Sectional Structure of Conventional Buried-Channel NMOS Transistor>

Figure 1:
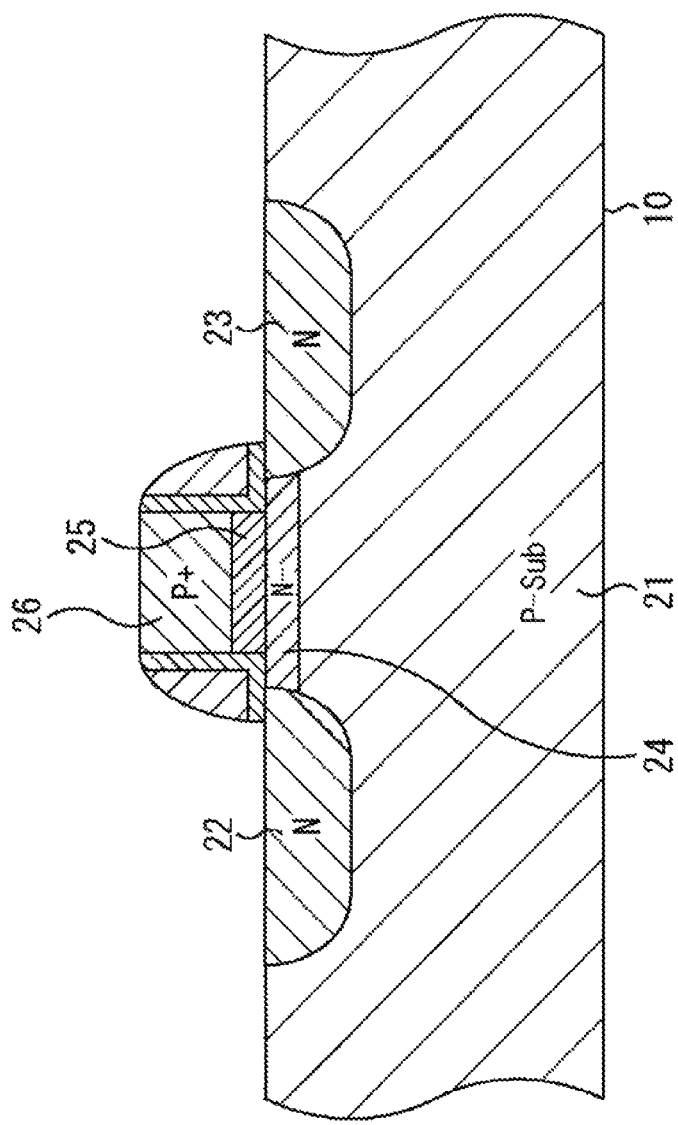
FIG. 1 is a cross-sectional view illustrating the structure of a buried-channel transistor.

FIG. 1 is a cross-sectional view illustrating the structure of a conventional buried-channel NMOS transistor 10. For comparison purposes, a conventional transistor will be described below prior to the description of a transistor according to the present technology.

Referring to FIG. 1, N-type diffusion layers 22 and 23 are formed on the substrate surface of a P-type semiconductor substrate 21 at a predetermined distance from each other to act as a drain region and a source region. Further, an N-type layer, for example, an N-layer 24 including phosphorus (P), is formed in a channel region, that is, in the vicinity of the substrate surface between the N-type diffusion layers 22 and 23. Furthermore, P+ polysilicon is used to form a gate electrode 26 on the substrate surface between the N-type diffusion layers 22 and 23 through a gate insulating film 25 such as SiO2.

<Potential Profile of Conventional Buried-Channel NMOS Transistor>

Figure 2:
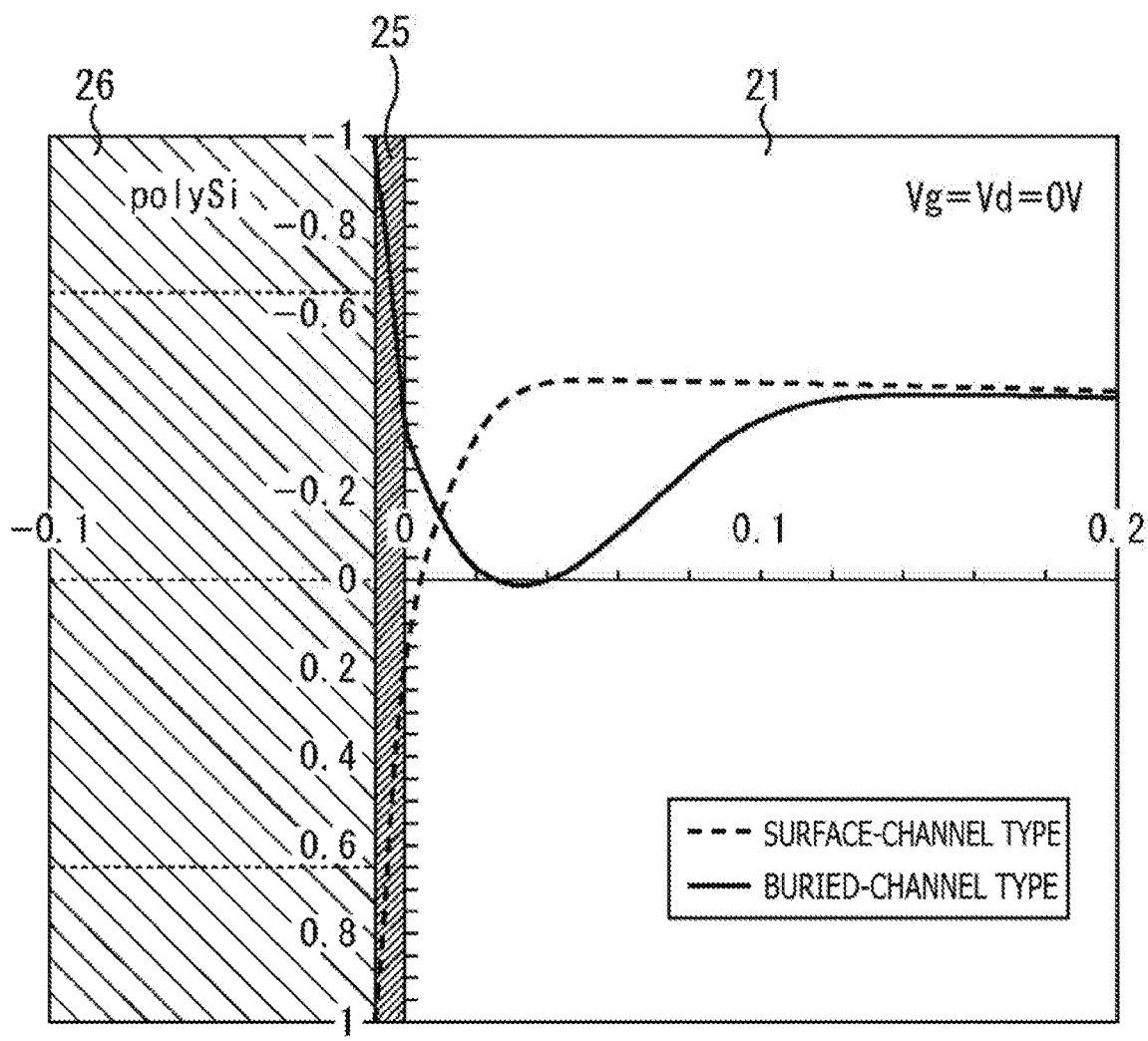
FIG. 2 is a diagram illustrating the depth-direction potential profiles of gate channel sections of a general surface-channel transistor and buried-channel transistor.

FIG. 2 illustrates the depth-direction potential profiles of gate channel sections of a general surface-channel NMOS transistor and conventional buried-channel NMOS transistor.

As is obvious from the potential profiles depicted in FIG. 2, a region of the minimum potential in a semiconductor substrate (silicon substrate), that is, a region where current flows, is formed at the interface between the gate insulating film and the substrate in the case of the surface-channel NMOS transistor, and formed in the substrate and away from the gate insulating film in the case of the buried-channel NMOS transistor. When an electron/hole trap level is formed at the interface between the gate insulating film and the substrate, the surface-channel NMOS transistor is more influenced by the electron/hole trap level than the buried-channel NMOS transistor.

For example, in a case where the buried-channel NMOS transistor 10 depicted in FIG. 1 is used as an amplifying transistor, the region of the minimum potential in the substrate 21 (the region where current flows) is not formed at the interface between the gate insulating film and the substrate, but is formed in the substrate 21 and away from the gate insulating film 25. Therefore, even if the electron/hole trap level is formed at the interface between the gate insulating film and the substrate, the influence of the electron/hole trap level upon the current flowing in a channel can be reduced.

That is, using the buried-channel NMOS transistor 10 (hereinafter simply referred to as the transistor 10) as an amplifying transistor makes it possible to reduce the fluctuation of current due to the electron/hole trap level, which results in the generation of 1/f noise. Consequently, the 1/f noise can be theoretically reduced without increasing the gate length (gate dimension) L and gate width (active region dimension) W of the transistor 10 or increasing a gate insulating film capacity Cox.

As described above, when the transistor 10 has a buried-channel structure, noise generation occurs due to the exchange of a carrier with a defect (trap) at an interface between a channel and a gate oxide film or a defect. (trap) on a Si surface. It can therefore be expected that the influence of the interface and the influence of the surface will be reduced by controlling a channel path.

However, in a case where the transistor 10 is used as an amplifying transistor or other transistor that is represented by a transistor operated under source follower bias conditions in an analog circuit by flowing a current having a predetermined or higher current value (operated in a saturation region), substrate bias conditions are determined by an operating current value when the transistor has the buried-channel structure. Therefore, the electron density distribution of a channel may be formed in the vicinity of the interface to reduce the effect of burying.

Further, the influence of RTN (random telegraph noise) has become significant due to the miniaturization and low-current operation of elements.

In an operating channel of a transistor, the number of carriers is small in the vicinity of a pinch-off point toward a drain having a strong electric field. Therefore, if RTN is generated in such a region, the characteristics of elements are significantly affected. That is, electron density at a drain end interface significantly affects RTN sensitivity. Consequently, it is conceivable that the electron density distribution formed in the vicinity of the interface may not significantly reduce RTN.

In view of the above circumstances, the transistor operated by flowing a current having a predetermined or higher current value (operated in a saturation region) is configured so that a source side determining Vth and a drain side having high RTN sensitivity differ in channel depth.

<Configuration of Transistor According to First Embodiment>

Figure 3:
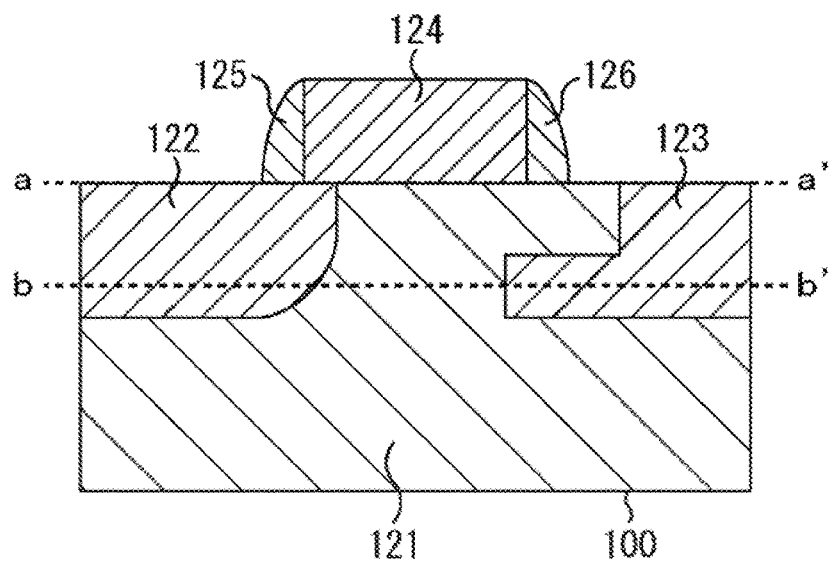
FIG. 3 is a cross-sectional view illustrating a configuration of a transistor according to an embodiment of the present technology.
Figure 4:
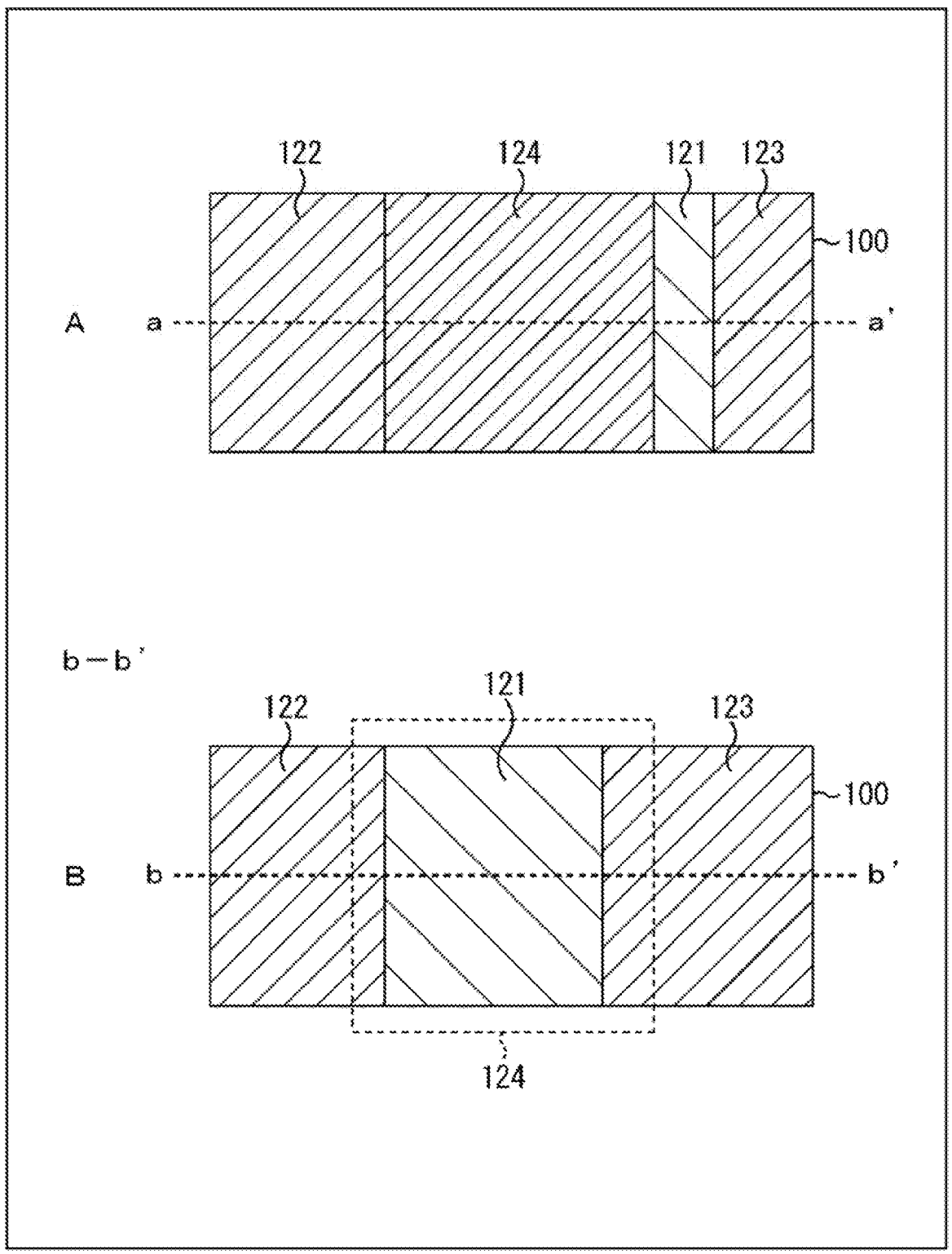
FIG. 4 is a plan view illustrating a configuration of the transistor according to the embodiment of the present technology.
Figure 5:
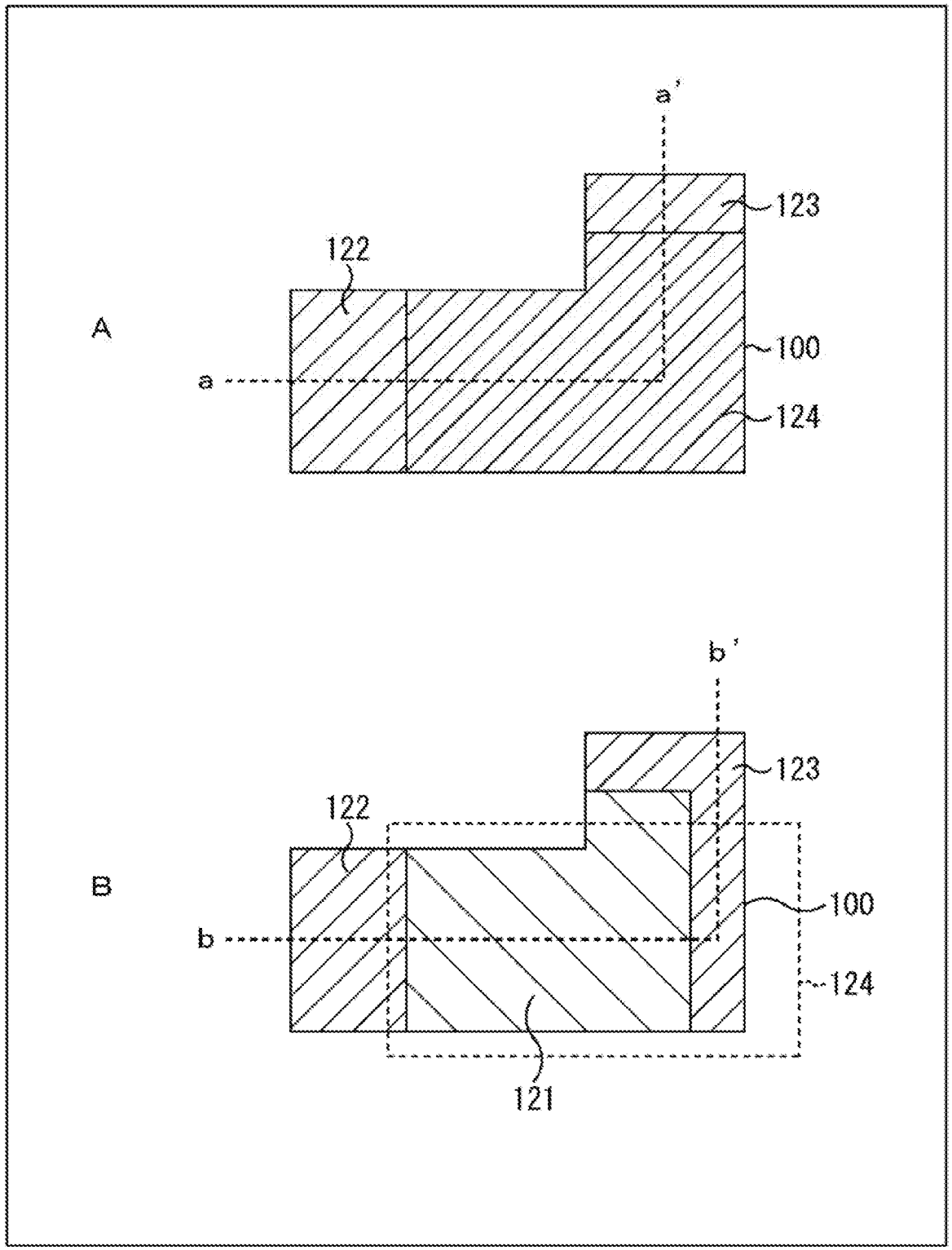
FIG. 5 is a plan view illustrating another configuration of the transistor according to the embodiment of the present technology.

FIG. 3 is a cross-sectional view illustrating an exemplary configuration of the transistor according to a first embodiment of the present technology. Further, FIG. 4 is a plan view illustrating an exemplary configuration of the transistor according to the first embodiment of the present technology. Furthermore, FIG. 5 is a plan view illustrating another exemplary configuration of the transistor according to the first embodiment of the present technology.

A transistor 100 depicted in FIG. 3 may have the same basic configuration as the transistor 10 depicted in FIG. 1. For example, the transistor 100 may be an N-type MOS transistor. A source 122 is formed in a left-side portion of a P-type semiconductor substrate 121 as illustrated in FIG. 3. The source 122 includes an N+ diffusion layer. Further, a drain 123 is formed in a right-side portion of the semiconductor substrate 121 as illustrated in FIG. 3. The drain 123 includes an N+ diffusion layer and is disposed at a distance from the source 122.

It should be noted that the following description deals, as an example, with an NMOS transistor. However, the present technology is also applicable to a PMOS transistor.

A gate 124 is formed on the semiconductor substrate 121 and disposed in a portion between the source 122 and the drain 123. In addition, although not depicted in FIG. 3, a gate insulating film may be formed between the semiconductor substrate 121 and the gate 124.

A sidewall 125 is formed on the gate 124 and disposed toward the source 122. A sidewall 126 is formed on the gate 124 and disposed toward the drain 126.

The sidewall 125 disposed toward the source 122 is in contact with the source 122. However, the sidewall 126 disposed toward the drain 123 is formed without being brought into contact with the drain 123.

The plan views of the transistor 100, which are depicted in FIGS. 4 and 5, will now be referenced. The transistor 100 depicted in FIG. 4 is configured, as an example, so that the source 122, the gate 124, and the drain 123 are linearly arranged. The transistor 100 depicted in FIG. 5 is configured, as an example, so that the source 122, the gate 124, and the drain 123 are arranged in an L-shaped configuration. It should be noted that the sidewall 126 is not depicted in FIGS. 4 and 5.

The plan view depicted in A of FIG. 4 is taken along line a-a' in FIG. 3. The plan view depicted in B of FIG. 4 is taken along line b-b' in FIG. 3. As illustrated in A of FIG. 4, the transistor 100 is configured so that the source 122, the gate 124, and the drain 123 are linearly arranged. Linear arrangement denotes one-directional arrangement, and indicates in FIG. 4 that the terminals of the transistor 100 are arranged in the left-right direction (transverse direction), for example. The transistor 100 having the linearly arranged source 122, gate 124, and drain 123 is hereinafter referred to as the linear transistor 100, as appropriate.

In the linear transistor 100, the gate 124 and the drain 123 are formed away from each other so that they do not come into contact with each other. That is, in the vicinity of the surface of the semiconductor substrate 121, the gate 124 and the drain 123 are configured so that they do not come into contact with each other.

Meanwhile, as illustrated in B of FIG. 4, the inside of the linear transistor 100 is configured so that the gate 124 and the drain 123 overlap in position. A portion marked by a broken line in B of FIG. 4 indicates the gate 124 formed on the surface of the semiconductor substrate 121. The gate 124 and the drain 123 are formed in such a manner that they overlap with each other.

The scope of application of the transistor 100 according to the present technology that has a cross-section depicted in FIG. 3 is not limited to a case where the source 122, the gate 124, and the drain 123 are linearly arranged as illustrated in FIG. 4. The present technology is also applicable to the transistor 100 that is configured as illustrated in FIG. 5.

The plan view depicted in A of FIG. 5 is taken along line a-a' in FIG. 3. The plan view depicted in B of FIG. 5 is taken along line b-b' in FIG. 3. As illustrated in A of FIG. 5, the transistor 100 is configured so that the source 122, the gate 124, and the drain 123 are arranged in an L-shaped configuration. The L-shaped configuration denotes two-directional arrangement, and indicates in FIG. 5 that the terminals of the transistor 100 are arranged in the left-right direction and in the up-down direction (transverse direction and longitudinal direction), for example. The transistor 100 having the source 122, gate 124, and drain 123 arranged in an L-shaped configuration is hereinafter referred to as the L-shaped transistor 100, as appropriate.

If a transistor simply designated as the "transistor 100" appears in the following description, represents either the linear transistor 100 or the L-shaped transistor 100.

As illustrated in B of FIG. 5, the inside of the L-shaped transistor 100 is configured so that the gate 124 and the drain 123 overlap in position. A portion marked by a broken line an B of FIG. 5 indicates the gate 124 formed on the surface of the semiconductor substrate 121. The gate 124 and the drain 123 are formed in such a manner that they overlap with each other.

As illustrated in FIGS. 3 to 5, the drain 123 is formed as a buried drain that is partially buried in the semiconductor substrate.

The drain 123 formed as a buried drain is formed so as to satisfy the following three conditions.

Condition 1: impurity regions of the source 122 and drain 123 are asymmetrical (are not equal in shape).

Condition 2: The impurity region of the drain 123 is formed deeper than the impurity region of the source 122.

Condition 3: At a gate end (at an end of the gate 124), the impurity region of the drain 123 is positioned away from the surface.

Three parameters will now be set. Further, for example, the shape and position of the impurity region of the drain 123 (hereinafter referred to as the drain region 123, as appropriate) will be described as well.

Figure 6:
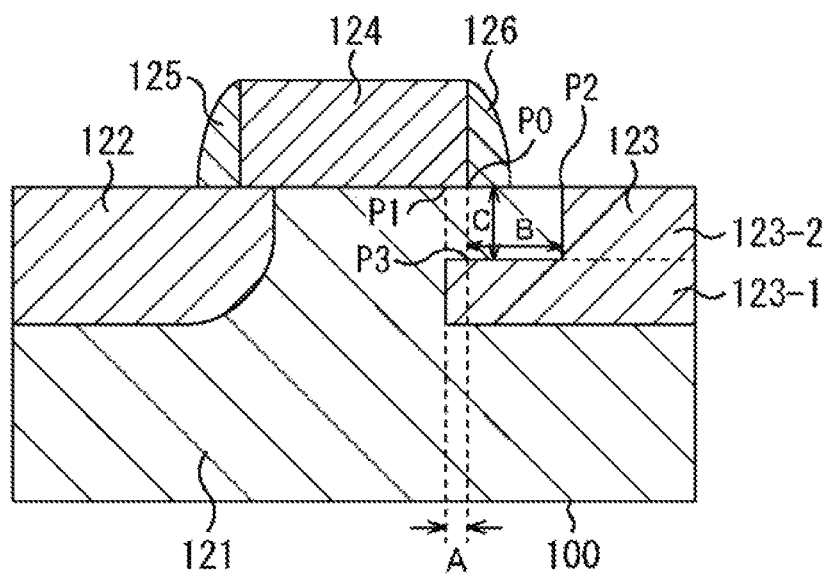
FIG. 6 is a diagram illustrating the shape and position of a drain.

Parameters A to C are defined as illustrated in FIG. 6. Further, the drain region 123 is divided into two portions, namely, upper and lower portions. The drain region 123 positioned deeper than the surface of the semiconductor substrate 121 (a side toward the gate 124) as referred to as the drain region 123-1. The drain region 123 in the vicinity of the surface of the semiconductor substrate 121 is referred to as the drain region 123-2. In addition, in a case where the drain region 123-1 and the drain region 123-2 need not be distinguished from each other (a region obtained by combining the drain region 123-1 and the drain region 123-2 is to be indicated), such a region will be simply referred to as the drain region 123.

Parameter A represents the amount of protrusion of the drain region 123 (drain region 123-1) from the sidewall 126 toward the gate 124. Referring to FIG. 6, in a case where position P0 is the position of the boundary between the gate 124 and the sidewall 126 (i.e., the gate end) and position P1 is the position of an end of the drain region 123 toward the gate 124, parameter A represents the length between position P0 and position P1.

FIG. 6 depicts a case where position P1 is below the gate 124. Alternatively, however, position P1 may be below the sidewall 126. In a case where point P0 is 0, the side toward the gate 124 is plus and the side toward the sidewall 126 is minus, parameter A is set, for example, within ±0.1 µm. Parameter A is set in consideration, for example, of short-circuiting to the source 122, gate length, suppression of channel shortening, and implantation alignment.

Parameter B represents the width of a high-resistance region of the drain region 123. Parameter B is the length from the position P0 of the boundary between the gate 124 and the sidewall 126 to a side of the drain region 123-2 toward the gate 124 (position P2).

Parameter C represents the depth of the drain region 123. In a case where position P0 is the position of the surface of the semiconductor substrate 121 and position P3 is the position of a side of the drain region 123-1 toward the surface of the semiconductor substrate 121 (i.e., the position in FIG. 6 of the boundary between the drain region 123-1 and the drain region 123-2), parameter C is the depth from position P0 to position P3.

Parameters B and C are set within a range, for example, of 0 to approximately 0.3 µm. Parameters B and C are set, for example, so as to ensure that a channel is positioned away from the surface and formed continuously without being interrupted by the electric field of the drain.

Figure 7:
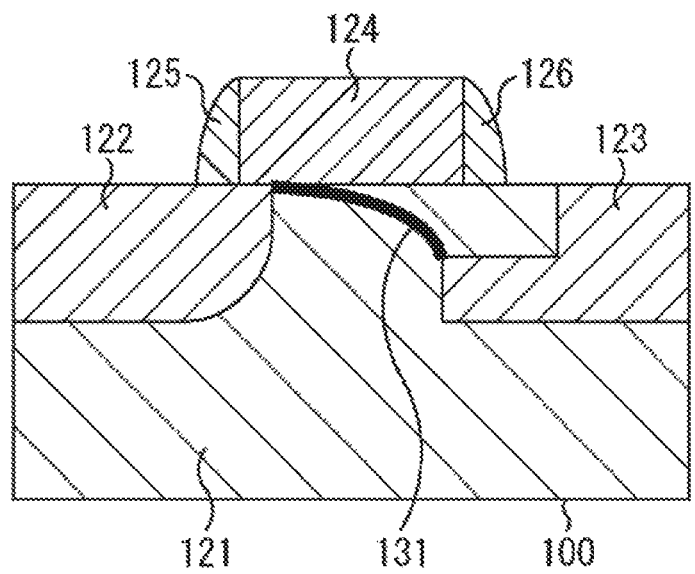
FIG. 7 is a diagram illustrating the formation of a channel.

When parameters A to C are properly set to form the drain region 123 in such a manner as to satisfy the above-mentioned conditions 1 to 3, a channel is formed as illustrated in FIG. 7.

Referring to FIG. 7, a channel 131 is formed between the source 122 and the drain 123 in such a manner that the channel 131 leaves the surface of the semiconductor substrate 121 (deepens) as it leaves the source 122 for the drain 123. That is, the channel 131 is formed at a deep position away from the surface.

Figure 8:
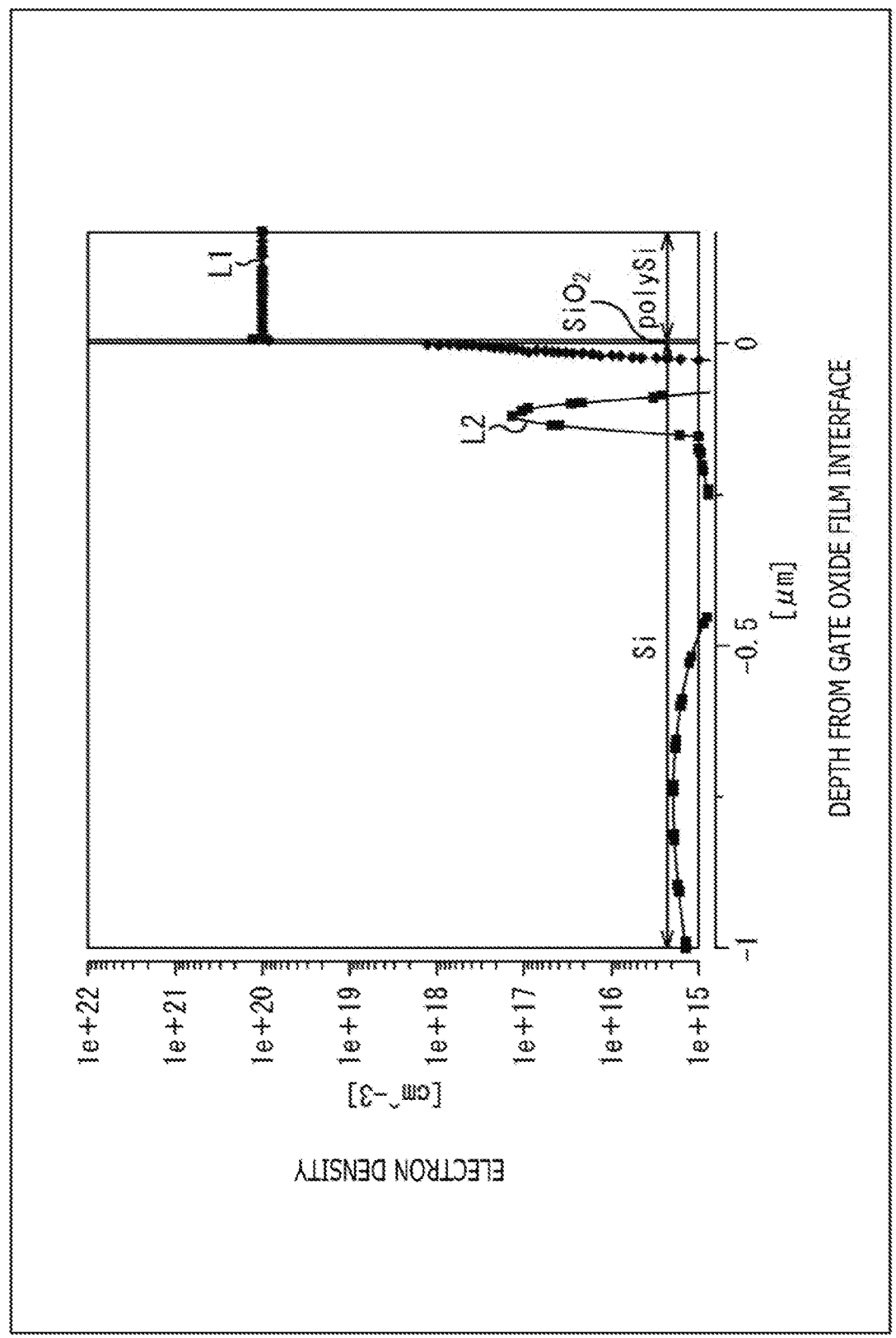
FIG. 8 is a diagram illustrating advantages provided by the transistor according to the present technology.

As described above, the present technology makes it possible to design a source impurity profile on the basis of a desired operating current value, place a drain channel current path at a deep position, and reduce the influence of RTN. FIG. 8 depicts the results of TCAD simulation that verify the above advantages.

In the graph of FIG. 8, the horizontal axis represents the depth from a gate oxide film interface (the depth from the surface of the semiconductor substrate 121), and the vertical axis represents electron density. Further, in the graph of FIG. 8, line L1 indicates the results obtained from a transistor that has a symmetrical structure with its source and drain both formed on the surface (e.g., the transistor 10 depicted in FIG. 1), and line L2 indicates the results obtained from the transistor 100 having a buried drain structure as depicted in FIG. 3.

As indicated in FIG. 8, when the electron density distribution in the direction of depth from the interface in the vicinity of the pinch-off point. (Pinchoff—0.06 µm) is determined, it can be verified that the peak of electron density indicated by line L2 is at a position deeper from the interface than indicated by line L1, and that peak concentration indicated by line L2 is lower than that indicated by line L1. This confirms that the channel 131 can be formed at a deep position as described above to reduce the influence of noise such as RTN.

As described above, the channel 131 can be formed at a deep position. Therefore, in the case of the linear transistor 100, which is configured so that the source 122, the gate 124, and the drain 123 are linearly arranged, the influence of noise can be reduced as described above. Further, as the channel 131 can be formed at a deep position, the influence of noise can be reduced even in the case of the L-shaped transistor 100 depicted in FIG. 5, which is configured so that the source 122, the gate 124, and the drain 123 are arranged in an L-shaped configuration.

In recent years, the region where a transistor is mounted is progressively reduced (transistor miniaturization). The L-shaped transistor 100 tends to become miniaturized more easily than the linear transistor 100. However, current may concentrate in a certain region of the L-shaped transistor 100. Therefore, the influence of noise may become significant in the case of the L-shaped transistor 100.

Figure 9:
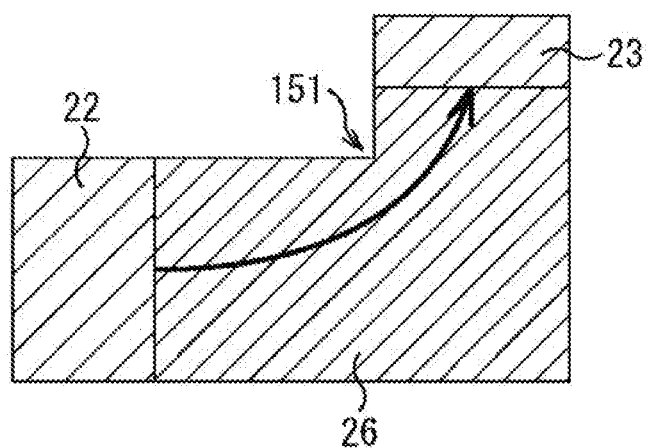
FIG. 9 is a diagram illustrating the flow of current.
Figure 9:
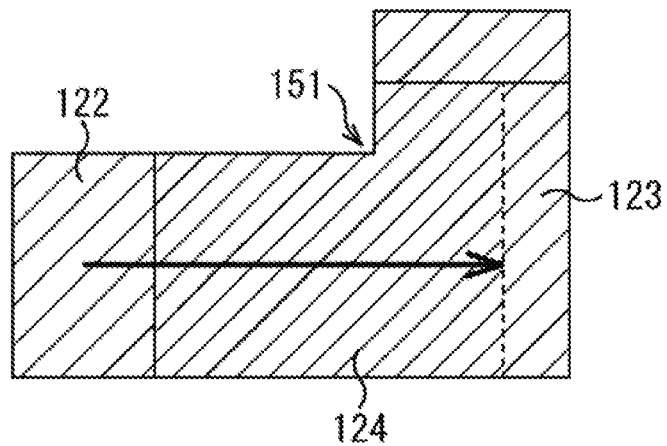

For example, illustrated in A of FIG. 9 is the flow of current in a case where a gate 26 and a drain 23 are in partial contact with each other in the vicinity of the surface of the semiconductor substrate 21 and a source 22, the gate 26, and the gate 23 are arranged in an L-shaped configuration as in the case of the transistor 10 depicted in FIG. 1. As indicated by an arrow in A of FIG. 9, the current flows in such a path as to minimize the distance between the source 22 and the drain 23. Therefore, the current tends to concentrate in the vicinity of an inner portion 151 of the L-shaped configuration.

If the concentration of current occurs in a certain region as described above, the gate width W of a transistor may decrease to reduce the gm (transconductance) of the transistor and increase noise. This may result in the degradation of reliability characteristics.

In the case of the transistor 100 according to the present technology, current flows as illustrated in B of FIG. 9. Illustrated in B of FIG. 9 is the flow of current in a case where the gate 126 and the drain 123 are not in contact with each other in the vicinity of the surface of the semiconductor substrate 121 due to the use of the buried drain structure and the source 122, the gate 126, and the gate 123 are arranged in an L-shaped configuration as in the case of the transistor 100 depicted in FIG. 3.

As indicated by an arrow in B of FIG. 9, the current flows in such a path as to minimize the distance between the source 122 and the drain 123. Therefore, the current flows to the drain 123 opposing the source 122 (to the buried drain 123). This makes it possible to avoid the concentration of current in the vicinity of the inner portion 151 of the L-shaped configuration. Consequently, it is possible to prevent a decrease in the gate width W of a transistor and a decrease in the gm (transconductance) of the transistor.

Further, it is possible to increase not only the gate width 8 of the L-shaped transistor 100 but also its gate length. (gate dimension) L. Therefore, applying the present technology reduces noise in the L-shaped transistor 100 as well. Moreover, as parasitic capacitance can be improved, it is possible to reduce the influence of noise.

Figure 10:
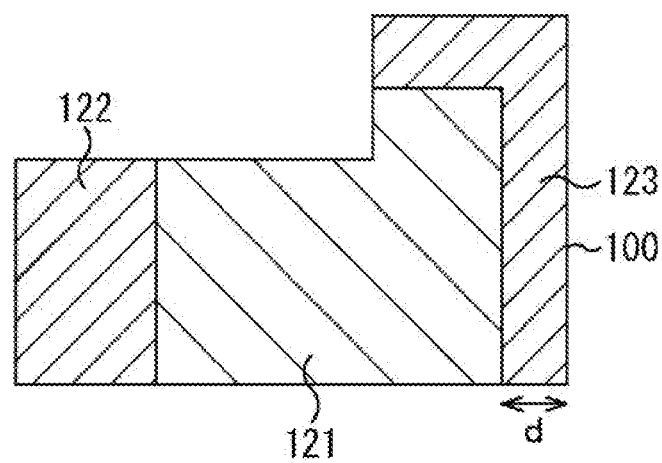
FIG. 10 is a diagram illustrating the size of a buried drain region.

Meanwhile, as regards the drain 123 of the L-shaped transistor 100, the width d (FIG. 10) of the buried drain 123 (hereinafter referred to as the buried drain region) may be, for example, approximately 5 to 20 nm, although depending on the size of the L-shaped transistor 100. Further, the buried drain region is formed at a position satisfying the above-mentioned conditions 1 to 3 (parameters A to C).

Moreover, the N-type concentration of the buried drain region of the linear transistor 100 and L-shaped transistor 100 may be, for example, $1e19$ $cm^{-3}$ or higher.

In a case where the buried drain region is formed, the function of the drain 123 can be exercised in the buried drain region. Therefore, the drain 123 disposed on the surface of the semiconductor substrate 121 may be used as a contact and formed in a smaller region than before.

Figure 11:
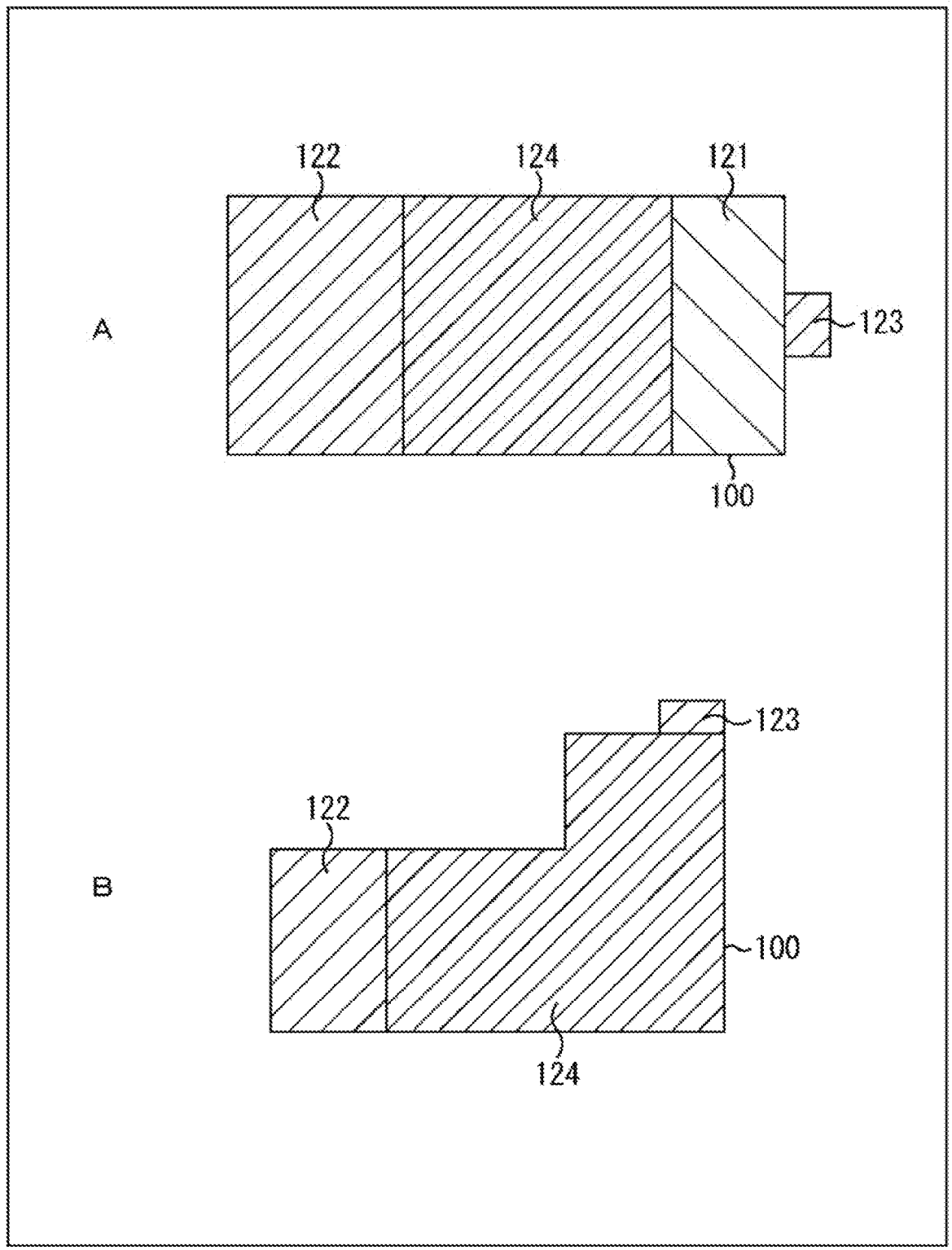
FIG. 11 is a diagram illustrating another shape of the drain.

For example, the drain 123 may be formed as illustrated in FIG. 11. As is the case with A of FIG. 4, a plan view depicted in A of FIG. 11 illustrates the surface of the semiconductor substrate 121 of the linear transistor 100. As illustrated in A of FIG. 11, the drain 123 to be formed on the surface of the semiconductor substrate 121 may be formed in a small region. This small region may be used as a contact.

Similarly, as is the case with A of FIG. 5, a plan view depicted in B of FIG. 11 illustrates the surface of the semiconductor substrate 121 of the L-shaped transistor 100. The drain 123 to be formed on the surface of the semiconductor substrate 121 may be formed in a small region. This small region may be used as a contact.

Parameters A to C, which have already been described with reference to FIG. 6, will now be described again. To obtain the above-described advantages, it is necessary to form the drain region 123 at a position away from the gate 124.

To form the drain region 123 at a position away from the gate 124, parameter C needs to be a value greater than 0. As far as parameter C is a value greater than 0, the drain region 123 can be formed at a position away from the gate 124 even if parameter B is set to 0.

Figure 12:
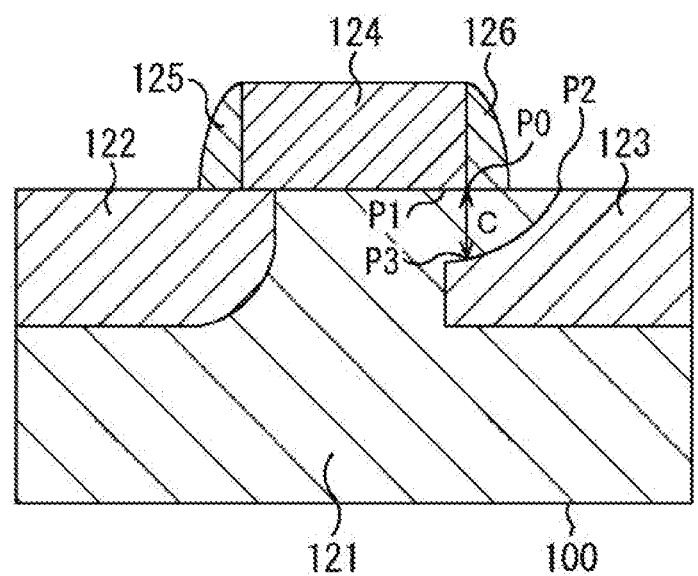
FIG. 12 is a diagram illustrating a shape of the drain.

For example, as illustrated in FIG. 12, the drain region 123 may be formed in such a shape that it is sloped from position P1 to position P2. When the drain region 123 is shaped as illustrated in FIG. 12, parameter B substantially represents the distance between position P3 and position P2 in the vicinity of the upper side of the drain region 123-1. However, at an end of the drain region 123-2 (at an end of a portion in contact with the surface of the semiconductor substrate 121), parameter B represents position P2 and is 0.

When the drain region 123 is shaped as illustrated in FIG. 12, parameter C substantially represents the distance between position P0 and position P3 at an end of the drain region 123-1 (toward the gate 124). When the distance to the drain region 123-2 decreases, parameter C is 0 in this case, too, at an end of the drain region 123-1, the drain region 123 is formed at a position away from the gate 124 (gate end). Therefore, the above-mentioned conditions are satisfied.

As regards parameter A, short-circuiting to the drain 123 may occur if the distance to the source 122 is excessively short, and the channel may not be continuously formed if the distance to the source 122 is excessively long. Therefore, parameter A is set in consideration, for example, of short-circuiting to the source 122, gate length, suppression of channel shortening, and implantation alignment as described earlier.

Accordingly, when, for example, the shape of the drain region 123 and the position of its formation are to be set, in order from the most important to the least important, the parameters indicative of settings are parameter C, parameter A, and parameter B.

<Method 1-1 of Drain Region Formation>

Figure 13:
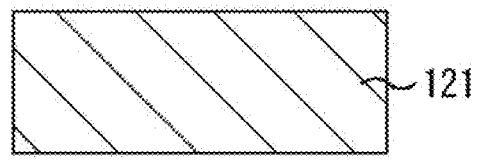
FIG. 13 is a diagram illustrating the manufacture of the transistor.
Figure 13:
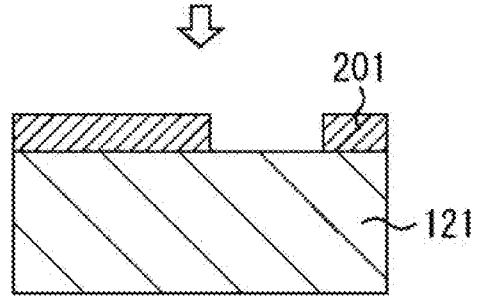
Figure 13:
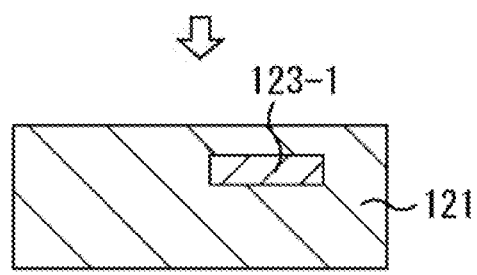
Figure 13:
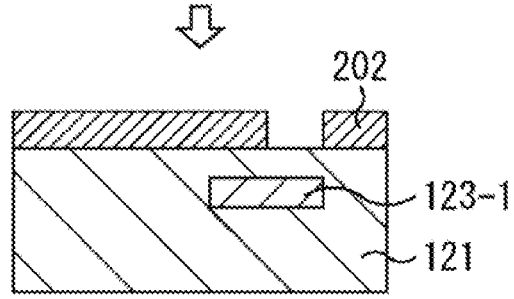
Figure 13:
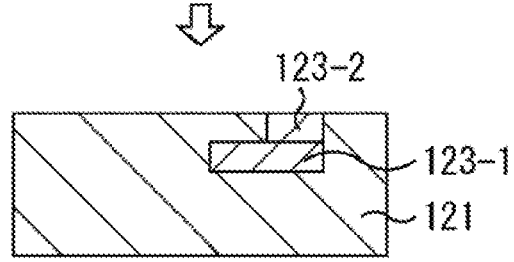

The drain region 123 is formed in accordance with the set parameters A to C. Formation of the drain region 123 will be described with reference to FIG. 13. FIG. 13 depicts a method 1-1 of drain region formation in relation to a case where, for example, the drain region 123 depicted in FIG. 3 is to be formed. Further, it is assumed that a portion other than the drain region 123 is formed by a conventional method and thus omitted as appropriate from the following description, and a process of forming the drain region 123 will be mainly described.

Moreover, the method 1-1 of drain region formation, which is described below, is applicable to both the formation of the linear transistor 100 and the formation of the L-shaped transistor 100.

In step S1, the semiconductor substrate 121 is prepared. In step S2, resist 201 is coated onto the semiconductor substrate 121. In order to form the drain region 123-1 at a deep position, a portion of the resist 201 that is placed at a position where the drain region 123-1 is to be formed is unnecessary and thus removed to form an opening. For example, lithography is applied to such resist patterning.

As depicted in step S2 of FIG. 13, after the resist is removed to form an opening at a position where the drain region 123-1 to be formed, the drain region 123-1 is formed by ion implantation. In a case where a PMOS transistor is to be manufactured, for example, boron (B) ions are implanted. In a case where an NMOS transistor is to be manufactured, arsenic (As) ions are implanted. After ion implantation, the coated resist 201 is removed.

As depicted in step S3 of FIG. 13, the drain region 123-1 to be placed at a deep position of the semiconductor substrate 121 (at a position away from the surface) is formed by the first ion implantation. When the drain region 123-1 is formed in steps S2 and S3, resist patterning and ion implantation are performed so as to satisfy the set parameters A and C. That is, the drain region 123-1 is formed at a depth from the surface of the semiconductor substrate 121 that is prescribed by parameter C, and in a predetermined size from a position prescribed by parameter A.

Further, is order to form the drain region 123-2, which is to be placed at a shallow position, ion implantation is performed again. That is, in step S4, resist patterning is performed to conduct ion implantation.

In resist patterning in step S4, an opening for forming the drain region 123-2, which is to be placed at a shallow position, is formed in resist 202.

The drain region 123-2 is formed by performing ion implantation after resist patterning. As depicted in step S5 of FIG. 13, the drain region 123-2 to be placed at a shallow position is formed by the second ion implantation.

When the drain region 123-2 is formed in steps 34 and S5, resist patterning and ion implantation are performed so as to satisfy the set parameter B. That is, the drain region 123-2 is formed in a predetermined size from a position that is away from an end of the gate 124 in accordance with the setting of parameter B.

It should be noted that, in steps S2 to S4, the source 122 may be formed in the same manner as the drain region 123. In a case where the source 122 is to be formed as well, an opening for forming the source 122 is also formed in the resist 202.

When resist patterning and ion implantation are performed twice as described above so as to satisfy the set parameters A to C, it is possible to form the drain region 123-1, which is at a position deep from the surface of the semiconductor substrate 121, and the drain region 123-2, which is in the vicinity of the surface of the semiconductor substrate 121.

It should be noted that the ions may be implanted, for example, vertically or obliquely as appropriate in accordance with the design values of parameters A to C. Further, the drain region 123 shaped as depicted in FIG. 12 can be formed by adjusting, for example, the angle of oblique implantation and the length of implantation time.

<Method 1-2 of Drain Region Formation>

Figure 14:
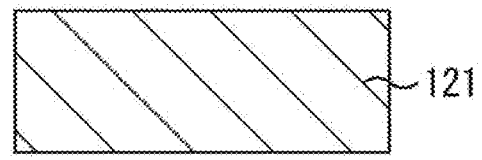
FIG. 14 is a diagram illustrating the manufacture of the transistor.
Figure 14:
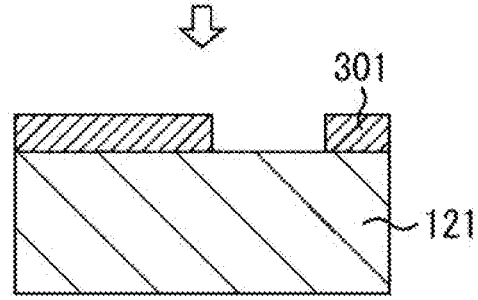
Figure 14:
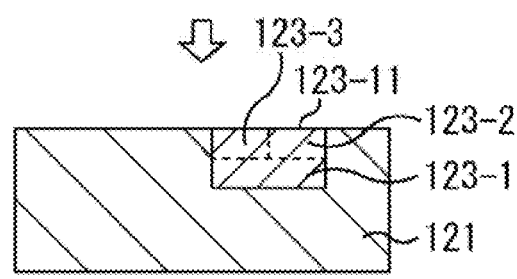
Figure 14:
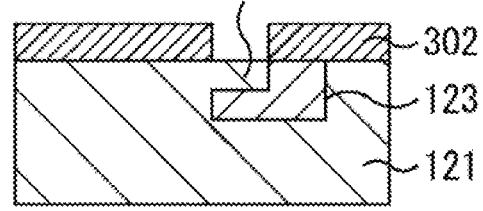
Figure 14:
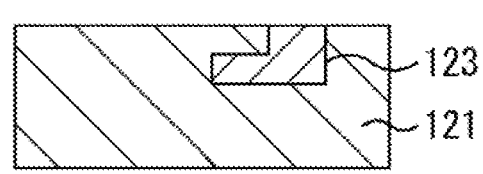

Another method of forming the drain region 123 depicted in FIG. 3 will now be described with reference to FIG. 14 (this method is referred to as the method 1-2 of drain region formation). FIG. 14 depicts only a process of forming the drain region 123. A portion other than the drain region 123 can be formed by a conventional method and is thus omitted as appropriate from the following description.

Further, the method 1-2 of drain region formation, which is described below, is applicable to both the formation of the linear transistor 100 and the formation of the L-shaped transistor 100.

In step S21, the semiconductor substrate 121 is prepared. In step S22, resist 301 is coated onto the semiconductor substrate 121. Processing performed in step S22 is the same as the processing performed in step S2 (FIG. 13). That is, as is the case with the resistor 201 (FIG. 13), in order to form the drain region 123-1 at a deep position, a portion of the resist 301 that is coated onto the semiconductor substrate 121 and placed at a position where the drain region 123-1 is to be formed is unnecessary and thus removed to form an opening.

For example, lithography may be applied to such resist patterning. Further, resist patterning is performed so as to satisfy parameter A, and then ion implantation is conducted.

As depicted in step S22 of FIG. 14, after the resist is removed to form an opening at a position where the drain region 123-1 is to be formed, a drain region 123-11 is formed by implanting phosphorus (P) ions and arsenic (As) ions. Formed in step S22 is the drain region 123-11, which includes the drain region 123-1, the drain region 123-2, and a drain region 123-3.

That is, as depicted in step S23 of FIG. 14, the drain region 123-11 is a region between the deepest part (base) of the drain region 123-1 and the vicinity of the surface of the semiconductor substrate 121, namely, a region having the width of the drain region 123-1. Therefore, as mentioned above, the drain region 123-11 is a region including the drain region 123-1, the drain region 123-2, and the drain region 123-3.

In a case where the drain region 123-11 formed as described above is to be changed to the drain region 123 depicted in FIG. 3, it is necessary to remove the drain region 123-3 from the drain region 123-11. Therefore, processing is performed in step S24 to cancel the conductivity of the drain region 123-3.

That is, resist patterning is performed to form an opening in a portion corresponding to the drain region 123-3, and for example, boron (B) ions are implanted into the drain region 123-3. When the second ion implantation is performed in this manner, a high-resistance region is formed so that the drain region 123 is formed as depicted in step S25 of FIG. 14.

The second resist patterning and ion Implantation are performed on the basis of the set parameters B and C. That is, for example, the size, shape, and position of the high-resistance region are prescribed by parameters B and C. Therefore, the second resist patterning and ion implantation are performed on the basis of the set parameters B and C.

When the resist patterning and ion implantation are performed twice so as to satisfy the set parameters A to C as described above, it is possible to form the drain region 123-1, which is at a position deep from the surface of the semiconductor substrate 121, and the drain region 123-2, which is in the vicinity of the surface of the semiconductor substrate 121.

That is, when the resist patterning and ion implantation are performed twice so as to satisfy parameters A to C, it is possible to form a high-resistance region and thus form the drain 123 having a different shape from the source 122.

It should be noted that the ions may be implanted, for example, vertically or obliquely as appropriate in accordance with the design values of parameters A to C. Further, the drain region 123 shaped as depicted in FIG. 12 can be formed by adjusting, for example, the angle of oblique implantation and the length of implantation time.

<Configuration of Transistor According to Second Embodiment>

Figure 15:
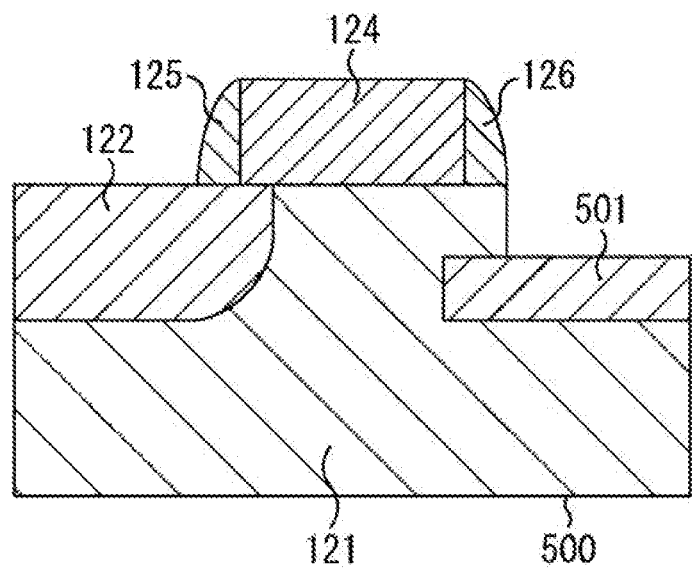
FIG. 15 is a diagram illustrating a configuration of the transistor according to another embodiment of the present technology.

FIG. 15 illustrates an exemplary configuration of the transistor according to a second embodiment of the present technology.

A transistor 500 depicted in FIG. 2 may have the same basic configuration as the transistor 100 depicted in FIG. 3. Therefore, like elements are designated by like reference numerals and will not be redundantly described. Further, the configuration of the transistor according to the second embodiment is applicable to both a linear transistor (referred to as the linear transistor 500) and an L-shaped transistor (referred to as the L-shaped transistor 500).

For example, the transistor 500 may be an N-type MOS transistor. Further, the source 122 including an N+ diffusion layer may be formed is a left-side portion of the type semiconductor substrate 121 as illustrated in FIG. 15, and a drain 501 including an N+ diffusion layer may be formed in a right-side portion of the semiconductor substrate 121 and disposed at a distance from the source 122.

It should be noted that the following description deals, as an example, with an NMOS transistor. However, the present technology is also applicable to a PMOS transistor.

The gate 124 is formed on the semiconductor substrate 121 and disposed in a portion between the source 122 and the drain 501. The sidewall 125 is formed on the gate 124 and disposed toward the source 122. The sidewall 126 is formed on the gate 124 and disposed toward the drain 501. In addition, although not depicted in FIG. 15, a gate insulating film may be formed between the semiconductor substrate 121 and the gate 124.

The sidewall 125 disposed toward the source 122 is in contact with the source 122. However, the sidewall 126 disposed toward the drain 501 is formed without being brought into contact with the drain 501.

Comparison between the transistor 500 depicted in FIG. 15 and the transistor 100 depicted in FIG. 3 reveals that the shape and position of the drain 501 are different from those of the drain 123. The drain 501 corresponds to the drain region 123-1 that forms the drain 123 of the transistor 100. That is, the shape and position of the drain 501 are such that the drain region 123-1 included in the drain 123 is removed from the drain 123 depicted in FIG. It should be noted that the drain 501 may differ in size from the drain region 123-1.

The transistor 500 depicted in FIG. 15 further differs from the transistor 100 depicted in FIG. 3 in that a portion where the drain 501 is formed is cut out (so as to form a recessed portion).

The drain 501 is a region corresponding to the drain region 123-1 as described above. Therefore, the drain 501 is formed so as to satisfy the following three conditions, as is the case with the drain region 123.

Condition 1: impurity regions of the source 122 and drain 501 are asymmetrical (are not equal in shape).

Condition 2: The impurity region of the drain 501 is formed deeper than the impurity region of the source 122.

Condition 3: At an end of the gate 124 (gate end), the impurity region of the drain 501 is positioned away from the surface.

Further, the drain 501 additionally satisfies condition 4 below.

Condition 4: The impurity region of the drain 501 is formed on the recessed portion.

Figure 16:
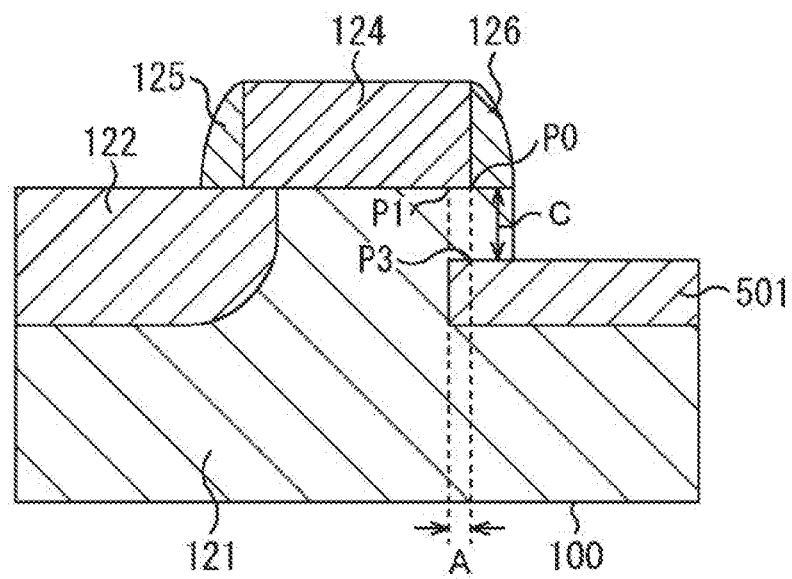
FIG. 16 is a diagram illustrating the shape and position of a drain.

For the drain 501, parameters A and C out of the aforementioned parameters A to C are set as depicted in FIG. 16. As depicted in FIG. 16, parameters A and C prescribe, for example, the shape and position of the impurity region of the drain 501 (hereinafter referred to as the drain region 501).

As is the case with parameter A depicted in FIG. 6, parameter A depicted in FIG. 16 represents the amount of protrusion of the drain region 501 from the gate end toward the gate 124. Referring to FIG. 16, in a case where position P0 is the position of the boundary between the gate 124 and the sidewall 126 (i.e., the gate end) and position P1 is the position of an end of the drain region 501 toward the gate 124, parameter A represents the length between position P0 and position P1.

FIG. 16 depicts a case where position P1 is below the gate 124. Alternatively, however, position P1 may be below the sidewall 126. In a case where point P0 is 0, the side toward the gate 124 is plus, and the side toward the sidewall 126 is minus, parameter 2 is set, for example, within ±0.1 μm. Parameter A is set in consideration, for example, of short-circuiting to the source 122, gate length, suppression of channel shortening, and implantation alignment.

Parameter C represents the depth of the drain region 501, namely, the depth of the recessed region toward the drain 501. In a case where position P0 is the position of the surface of the semiconductor substrate 121 (the position of the boundary between the semiconductor substrate 121 and the sidewall 126) and position P3 is the position of the upper side of the drain region 501, parameter C is the depth from position P0 to position P3.

Parameter C is set within a range, for example, between 0 and approximately 0.3 μm (excluding 0). Parameter C is set, for example, so as to ensure that a channel is positioned away from the surface and formed continuously without being interrupted by the electric field of the drain.

Figure 17:
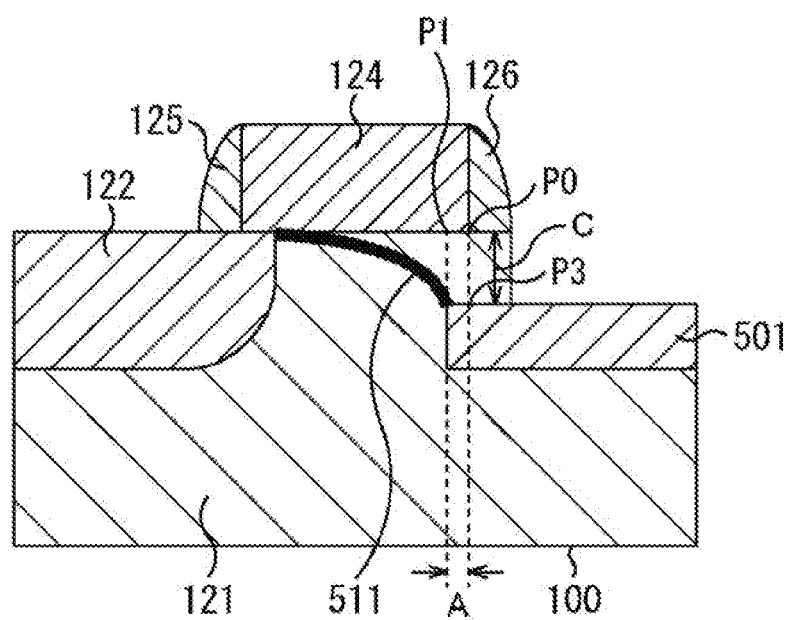
FIG. 17 is a diagram illustrating the formation of a channel.

When parameters A and C are properly set to form the drain region 501 in such a manner as to satisfy the above-mentioned conditions 1 to 4, a channel is formed as illustrated in FIG. 17.

Referring to FIG. 17, a channel 511 is formed between the source 122 and the drain 501 in such a manner that the channel 511 leaves the surface of the semiconductor substrate 121 (deepens) as it leaves the source 122 for the drain 501. That is, the channel 511 is formed at a deep position away from the surface.

As described above, the present technology makes it possible to design the source impurity profile on the basis of a desired operating current value, place the drain channel current path at a deep position, and reduce the influence of RTN. FIG. 8 depicts the results of TCAD simulation that verify the above advantages. The results depicted in FIG. 8 have already been described and will not be described again here.

Method 2-1 of Drain Region Formation;

The drain region 501 is formed in accordance with the set parameters A and C. Formation of the drain region 501 will be described with reference to FIG. 18. FIG. 18 depicts a method 2-1 of drain region formation in relation to a case where, for example, the drain region 501 depicted in FIG. 15 is to be formed. Further, it is assumed that a portion other than the drain region 501 is formed by a conventional method and thus omitted as appropriate from the following description, and a process of forming the drain region 501 will be mainly described.

Moreover, the method 2-1 of drain region formation, which is described below, is applicable to both the formation of the linear transistor 500 and the formation of the L-shaped transistor 500.

In step S51, the semiconductor substrate 121 is prepared. In step S52, a recessing process is performed to make a recess in a portion forming the drain region 501. The recess for forming the drain region 501 is made in the semiconductor substrate 121.

In step S53, resist 601 is coated onto the semiconductor substrate 121. In order to form the drain region 501, a portion of the resist 601 that is placed at a position where the drain region 501 is to be formed is unnecessary and thus removed to form an opening. For example, lithography may be applied to such resist patterning.

As depicted in step S53 of FIG. 18, after the resist is removed to form an opening at a position where the drain region 501 is to be formed, the drain region 501 is formed by ion implantation. In a case where a PMOS transistor is to be manufactured, for example, boron (B) ions are implanted. In a case where an NMOS transistor is to be manufactured, arsenic (As) ions are implanted. After ion implantation, the coated resist 601 is removed.

As depicted in step S54 of FIG. 18, the drain region 501 is formed by ion implantation after recessing. When the drain region 501 is formed in steps S52 and S53, resist patterning and ion implantation are performed so as to satisfy the set parameters A and C. That is, the semiconductor substrate 121 is recessed to perform ion implantation in such a manner that the drain region 501 is formed at a depth from the surface of the semiconductor substrate 121 that is prescribed by parameter C, and in a predetermined size from a position prescribed by parameter A.

Figure 19:
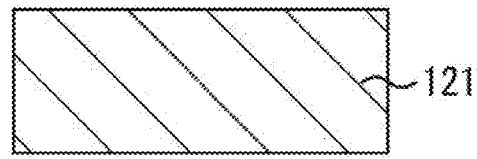
FIG. 19 is a diagram illustrating the manufacture of the transistor.
Figure 19:
Figure 19:
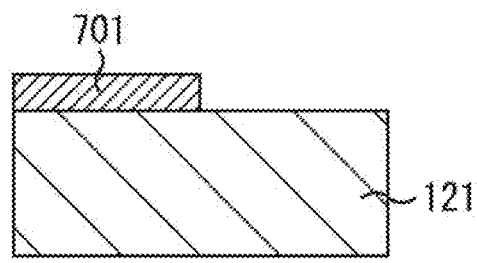
Figure 19:
Figure 19:
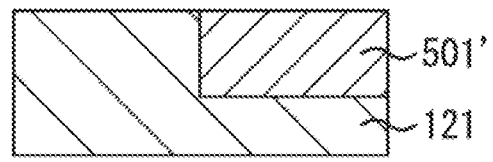
Figure 19:
Figure 19:
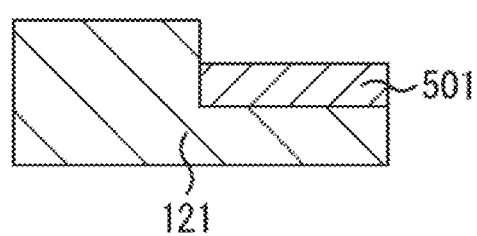

Ion implantation is performed in accordance with the design values of parameters A and C. In the case of oblique implantation, as depicted in step S54 of FIG. 18, the drain region 501 is formed at a position below the recessed portion and to a position below the sidewall 126 (not depicted in FIG. 18). In the case of vertical implantation, the drain region 501 is formed at a position below the recessed portion (e.g., the drain region 501 depicted in step S74 of FIG. 19 is formed).

When recessed-portion formation, resist patterning, and ion implantation are performed so as to satisfy parameter A and C as described above, the drain region 501 can be formed at a position deep from the surface of the semiconductor substrate 121, that is, at a position deeper than the source 122.

<Method 2-2 of Drain Region Formation>

Another method of forming the drain region 501 depicted in FIG. 15 will now be described with reference to FIG. 19 (this method is referred to as the method 2-2 of drain region formation). The method 2-1 of drain region formation, which has been described with reference to FIG. 18, forms the drain region 501 by performing ion implantation after forming the recessed portion. However, the method 2-2 of drain region formation, which is depicted in FIG. 19, forms the recessed portion after ion implantation.

Further, the method 2-2 of drain region formation, which is described below, is applicable to both the formation of the linear transistor 500 and the formation of the L-shaped transistor 500.

In step S71, the semiconductor substrate 121 is prepared. In step S72, resist 701 is coated onto the semiconductor substrate 121. In order to form the drain region 501, a portion of the resist 701 that is placed at a position where the drain region 501 is to be formed is unnecessary and thus removed to form an opening. For Example, lithography may be applied to such resist patterning.

As depicted in step S72 of FIG. 19, after the resist is removed to form an opening at a position where the drain region 501 is to be formed, the drain region 501 is formed by ion implantation. In a case where a PMOS transistor is to be manufactured, for example, boron (B) ions are implanted. In a case where an NMOS transistor is to be manufactured, arsenic (As) ions are implanted. After ion implantation, the coated resist 701 is removed.

The method 2-2 of drain region formation forms a diffusion layer acting as the drain region 501, and then removes a part of the formed diffusion layer. Therefore, a drain region 501' formed in steps S72 and S73 is greater than the drain region 501 that eventually remains. In order to indicate that the drain region 501' includes the eventually remaining drain region 501, the drain region 501' formed in steps S72 and S73 is marked with an apostrophe.

It should be noted that the drain region 501' is formed from the surface of the semiconductor substrate 121 to the base of the drain region 501. As the source 122 is also formed from the surface of the semiconductor substrate 121, the source 122 may be formed in a configuration for forming the drain region 501'.

When the drain region 501' is formed in step 373, the recessed portion is formed in step 374 by performing a recessing process of making a recess in the upper portion the drain region 501'.

As depicted in step S74 of FIG. 19, the drain region 501 is formed by performing the recessing process after ion implantation. When the drain region 501' is formed in steps S72 and S73, resist patterning and ion implantation are performed so as to satisfy the set parameter A. That is, ion implantation is performed in such a manner that the drain region 501' is formed from a position prescribed by parameter A and in a predetermined size.

When the drain region 501 is to be formed in step S74, the semiconductor substrate 121 is recessed to a depth from the surface of the semiconductor substrate 121 that is prescribed by parameter C.

When resist patterning, ion implantation, and recessed-portion formation are performed so as to satisfy parameters A and C as described above, the drain region 501 can be formed at a position deep from the surface of the semiconductor substrate 121, that is, at a position deeper than the source 122.

It should be noted that the ions may be implanted, for example, vertically or obliquely as appropriate in accordance with the design values of parameters A and C. In the case of vertical ion implantation, the drain region 501 depicted in step S74 of FIG. 19 is formed in the case of oblique ion implantation (e.g., implantation in the direction from upper right to lower left in FIG. 19), the drain region 501' shaped like a parallelogram is formed with its upper portion (e.g., its upper half) removed so that the resulting drain region 501 is similar in shape to the drain region 501 that is formed at a position below the recessed portion and to a position below the sidewall 126 (not depicted in FIG. 18) as depicted in step S54 of FIG. 18.

As described above, the present technology provides a transistor that permits the source impurity profile to be designed on the basis of a desired operating current value, allows the drain channel current path to be placed at a deep position, and reduces the influence of RTN. Further, the present technology makes it possible to manufacture such a transistor.

Exemplary Applications

The above-described transistor 100 and transistor 500 (the following description deals with, for example, the transistor 100) can be used as an amplifying transistor. Further, in a case where the transistor 100 according to the present technology is used as an amplifying transistor, the amplifying transistor can be used as an amplifying transistor that forms, for example, an image sensor.
<Exemplary Configuration of Solid-State Imaging Apparatus according to Present Technology>

Figure 20:
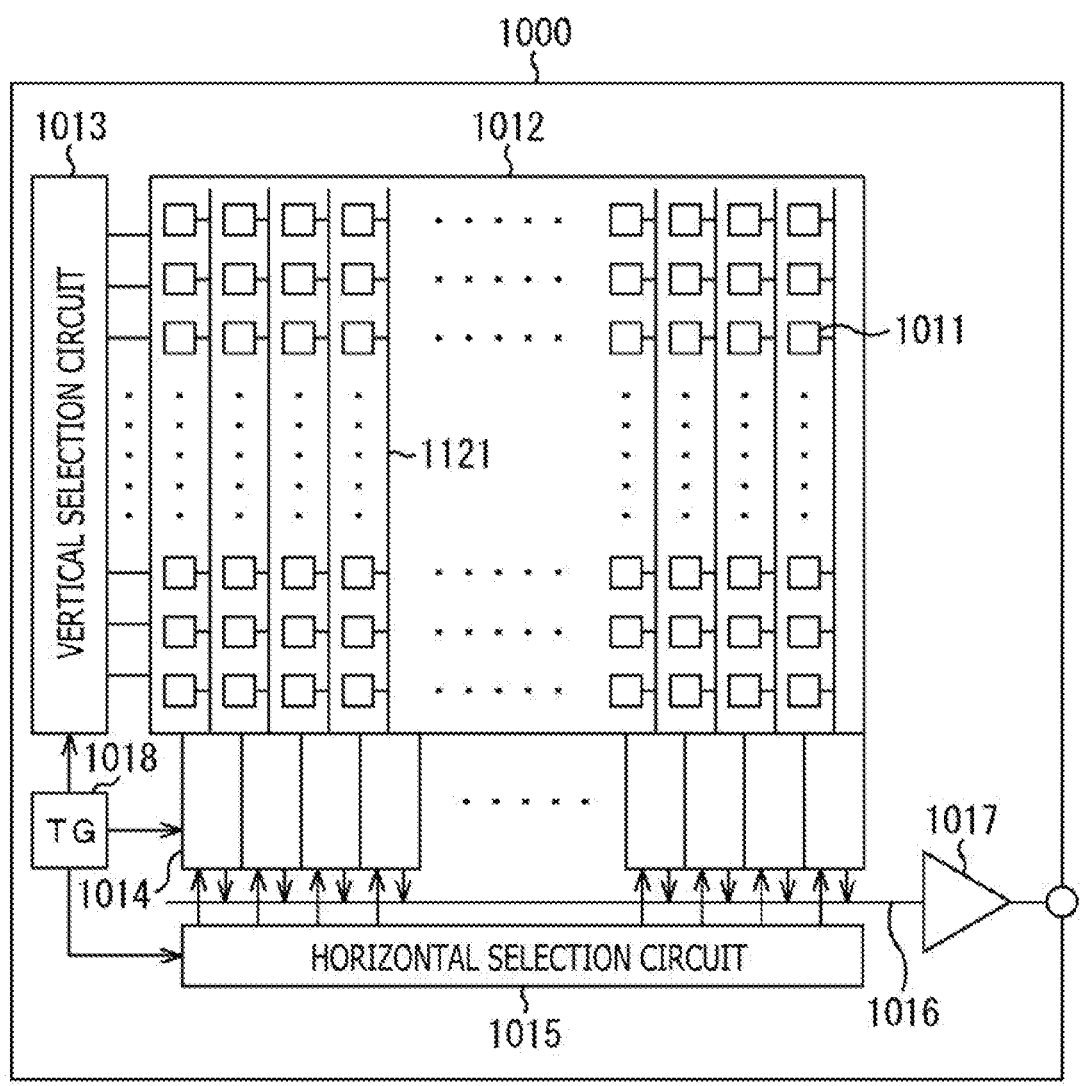
FIG. 20 is a diagram illustrating an exemplary application of the transistor according to the present technology.

FIG. 20 is a block diagram illustrating an exemplary configuration of an amplifying solid-state imaging apparatus according to the present technology, for example, an MOS (metal oxide semiconductor) image sensor. As illustrated in FIG. 20, the MOS image sensor 1000 according to the present exemplary application is configured as an area sensor including, for example, a unit pixel 1011, a pixel array section 1012, a vertical selection circuit 1013, a column circuit 1014, a horizontal selection circuit 1015, a horizontal signal line 1016, an output circuit 1017, and a timing generator (TG) 1018. The unit pixel 1011 includes a photoelectric conversion element such as a photodiode. The pixel array section 1012 is obtained by arraying the unit pixels 1011 two-dimensionally in the form of a matrix. The column circuit 1014 acts as a signal processing circuit.

Figure 21:
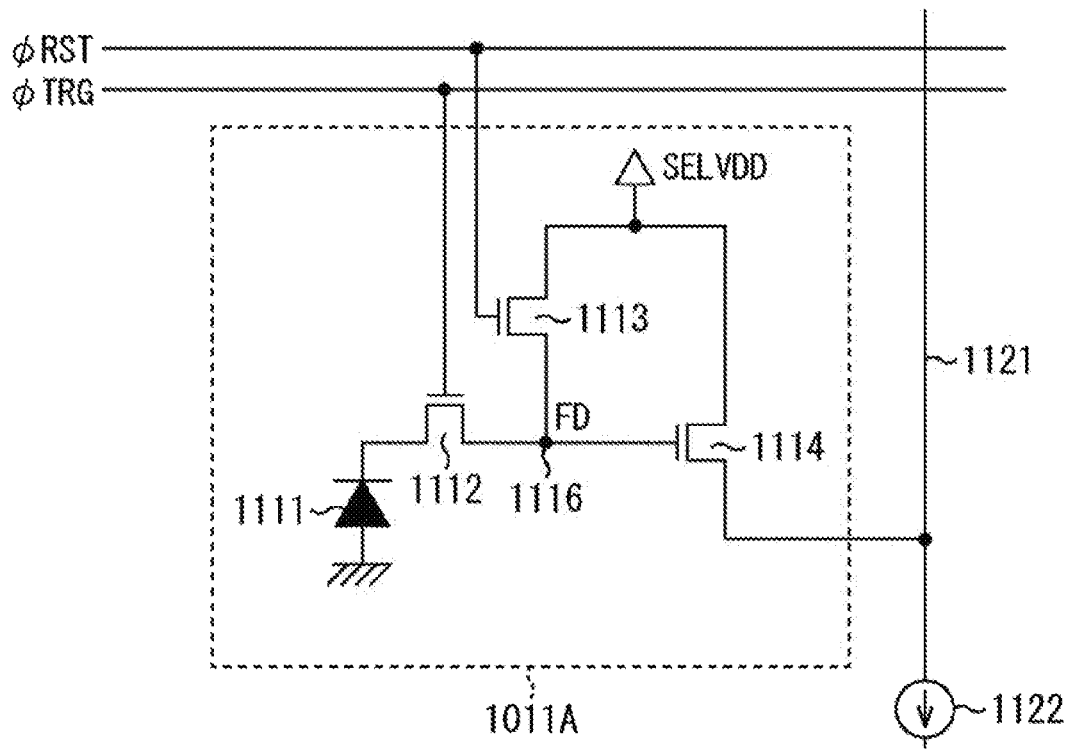
FIG. 21 is a diagram illustrating a configuration of a pixel.
Figure 22:
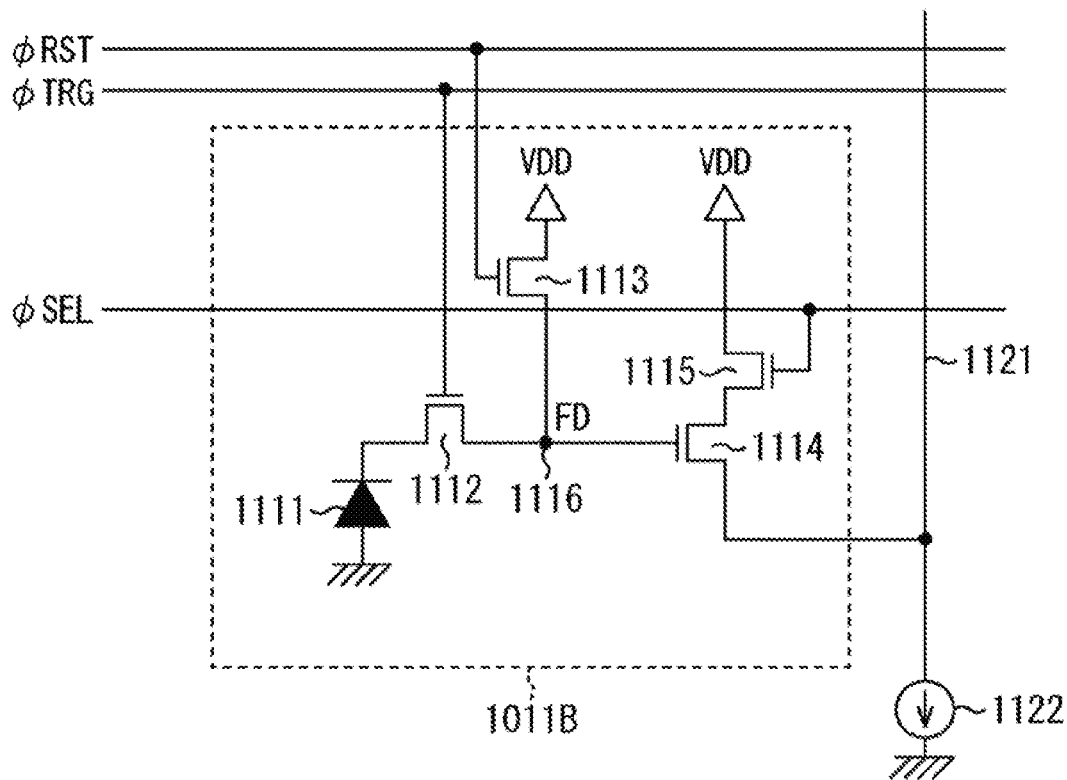
FIG. 22 is a diagram illustrating a configuration of a pixel.

In the pixel array section 1012, a vertical signal line 1121 is wired for each column of a matrix pixel array. The circuit configuration of the unit pixel 1011 will be described in detail later. The vertical selection circuit 1013 includes, for example, a shift register, and selectively drives, on an individual row basis, each unit pixel 1011 in the pixel array section 1012 by sequentially outputting, on an individual row basis, control signals such as a transfer signal for driving a transfer transistor 1112 (FIGS. 21 and 22) of the unit pixel 1011 and a reset signal for driving a reset transistor 1113 (FIGS. 21 and 22).

The column circuit 1014 is a signal processing circuit that is disposed for each horizontal pixel in the pixel array section 1012, that is, for each vertical signal line 1121. The column circuit 1014 includes, for example, an S/H (sample-and-hold) circuit and a CDS (correlated double sampling) circuit. The horizontal selection circuit 1015 includes, for example, a shift register, sequentially selects the signal of each unit pixel 1011, which is outputted through the column circuit 1014, and outputs the selected signal to the horizontal signal line 1016. It should be noted that a horizontal selection switch is omitted from FIG. 20 for purposes of drawing simplification. The horizontal selection circuit 1015 sequentially drives the horizontal selection switch to turn it on/off on an individual column basis.

The signals of the unit pixels 1011, which are sequentially outputted from the column circuit 1014 on an individual column basis due to the selective driving operation of the horizontal selection circuit 1015, are supplied to the output circuit 1017 through the horizontal signal line 1016, subjected to signal processing, such as amplification, in the output circuit 1017, and outputted to the outside of a device. The timing generator 1018 generates various timing signals, and controls the driving, for example, of the vertical selection circuit 1013, column circuit 1014, and horizontal selection circuit 1015 in accordance with the generated timing signals.

<Exemplary Configuration of Pixel Circuit Including Three Transistors>

FIG. 21 is a circuit diagram illustrating an exemplary circuit configuration including three transistors that are included in the circuit configuration of the unit pixel 1011. As illustrated in FIG. 21, a unit pixel 1011A according to the present exemplary circuit is a pixel circuit that includes three transistors, for example, a transfer transistor 1112, a reset transistor 1113, and an amplifying transistor 1114, in addition to a photoelectric conversion element such as a photodiode 1111. Here, for example, N-channel MOS transistors are used as the transistors 1112 to 1114.

The transfer transistor 1112 is connected between the cathode of the photodiode 1111 and an FD (floating diffusion) section 1116. A signal charge (electrons in the present example) obtained by photoelectric conversion in the photodiode 1111 and stored in the photodiode 1111 is transferred to the FD section 1116 when a transfer pulse φTRG is given to the gate.

The drain of the reset transistor 1113 is connected to a selective power supply SELVDD, and the source of the reset transistor 1113 is connected to the FD section 1116. The reset transistor 1113 resets the potential of the FD section 1116 when a reset pulse φRST is given to the gate before a signal charge transfer from the photodiode 1111 to the FD section 1116. The selective power supply SELVDD is a power supply that selects the VDD level or the GND level as a power supply voltage.

The amplifying transistor 1114 uses a source-follower configuration such that the gate is connected to the FD section 1116, and that the drain is connected to the selective power supply SELVDD, and further that the source is connected to the vertical signal line 1121. When the selective power supply SELVDD selects the VDD level, the amplifying transistor 1114 becomes operative and selects the unit pixel 1011A, outputs, to the vertical signal line 1121 as a reset level, the potential of the FD section 1116 that has been reset by the reset transistor 1113, and further outputs, to the vertical signal line 1121 as a signal level, the potential of the FD section 1116 that is obtained after the signal charge transfer by the transfer transistor 1112.

<Exemplary Configuration of Pixel Circuit Including Four Transistors>

Figure 23:
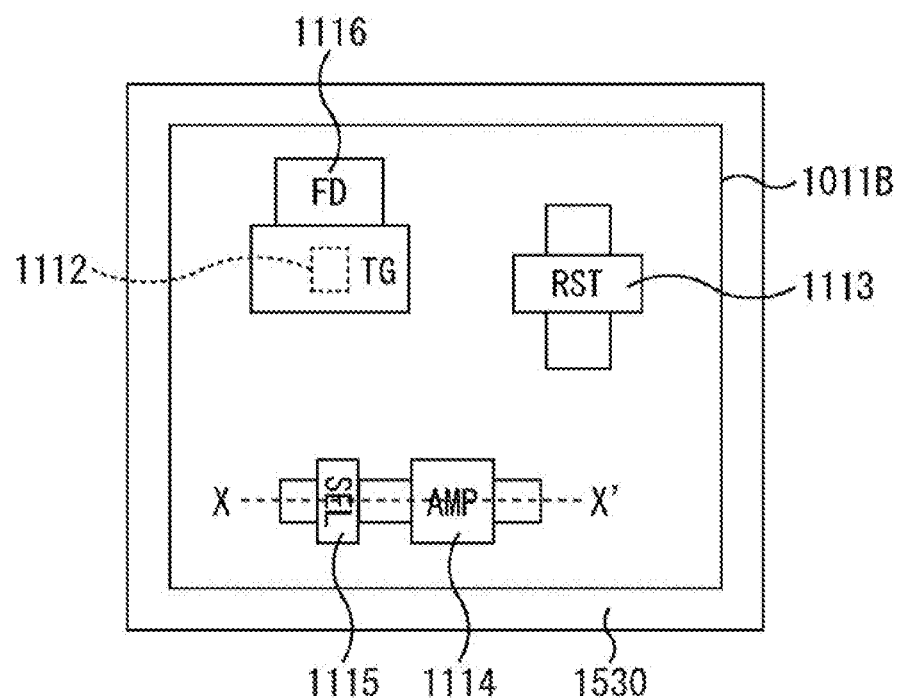
FIG. 23 is a plan view illustrating a configuration of a pixel.

FIG. 22 is a circuit diagram illustrating as exemplary circuit configuration including four transistors that are included in the circuit configuration of the unit pixel 1011. Further, FIG. 23 is a plan view illustrating a case where the unit pixel 1011 includes four transistors. Moreover, FIG. 24 is a cross-sectional view of a unit pixel 1011B taken along line X-X' in FIG. 23.

Figure 24:
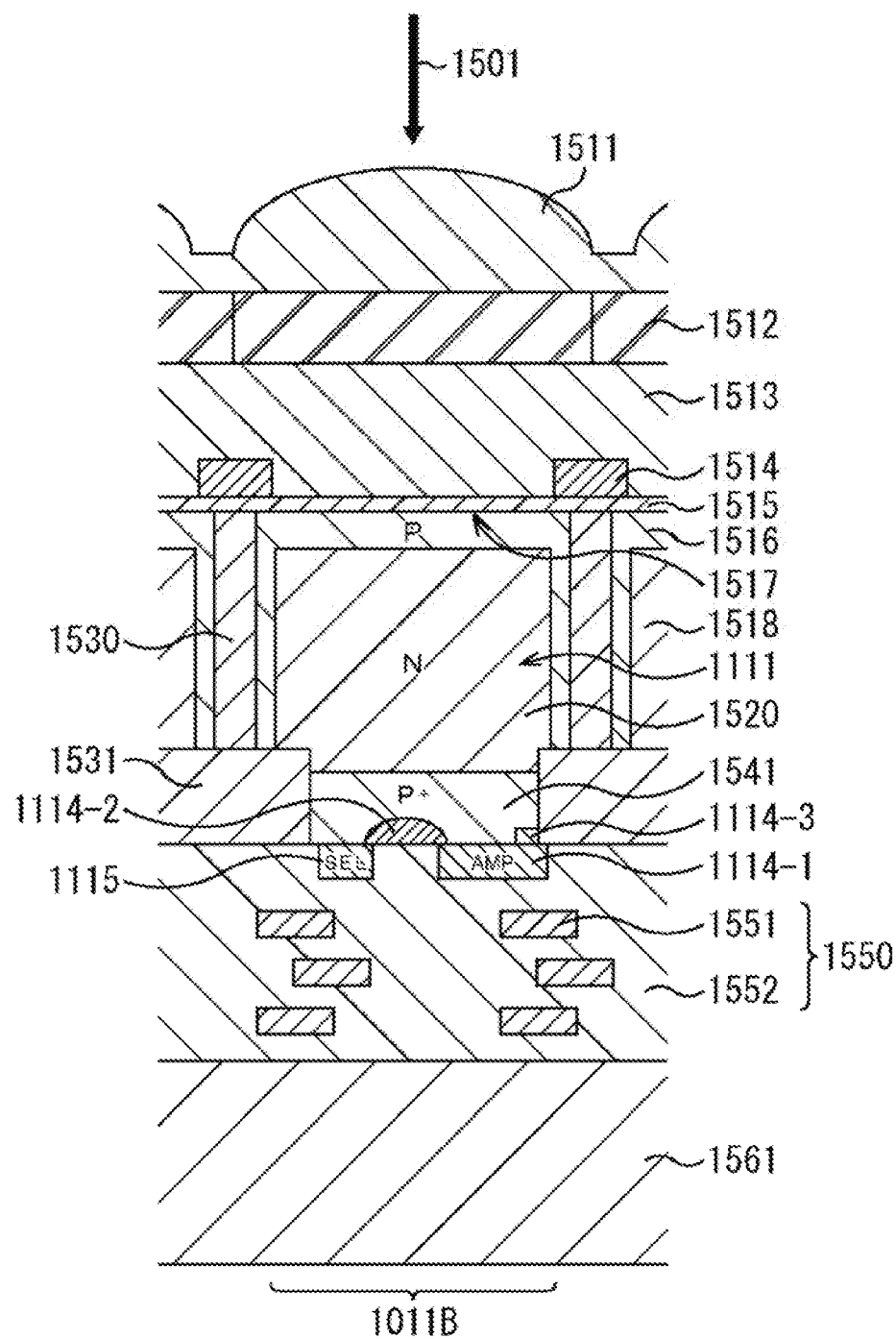
FIG. 24 is a cross-sectional view illustrating a configuration of a pixel.

As illustrated in FIGS. 22, 23, and 24, the unit pixel 1011B according to the present exemplary circuit is a pixel circuit that includes four transistors, for example, the transfer transistor 1112, the reset transistor 1113, the amplifying transistor 1114, and a selection transistor 1115 in addition to a photoelectric conversion element such as the photodiode 1111. Here, for example, N-channel MOS transistors are used as the transistors 1112 to 1115.

The transfer transistor 1112 is connected between the cathode of the photodiode 1111 and the floating diffusion (FD) section 1116. A signal charge (electrons in the present example) obtained by photoelectric conversion in the photodiode 1111 and stored in the photodiode 1111 is transferred to the FD section 1116 when the transfer pulse φTRG is given to the gate.

The drain of the reset transistor 1113 is connected to a power supply VDD, and the source of the reset transistor 1113 is connected to the FD section 1116. The reset transistor 1113 resets the potential of the ED section 1116 when the reset pulse φRST is given to the gate before a signal charge transfer from the photodiode 1111 to the FD section 1116.

The drain of the selection transistor 1115 is connected, for example, to the power supply VDD, and the source of the selection transistor 1115 is connected to the drain of the amplifying transistor 1114. When a selection pulse φSEL is given to the gate, the selection transistor 1115 turns on, and selects the unit pixel 1011B by supplying a power supply voltage VDD to the amplifying transistor 1114. It should be noted that the selection transistor 1115 may be connected between the source of the amplifying transistor 1114 and the vertical signal line 1121.

The amplifying transistor 1114 uses a source-follower configuration such that the gate is connected to the FD section 1116, and that the drain is connected to the source of the selection transistor 1115, and further that the source is connected to the vertical signal line 1121. The amplifying transistor 1114 outputs, to the vertical signal line 1121, as a reset level, the potential of the FD section 1116 that has bees reset by the reset transistor 1113, and further outputs, to the vertical signal line 1121, as a signal level, the potential of the FD section 1116 that is obtained after the signal charge transfer by the transfer transistor 1112.

The cross-sectional view of the unit pixel 1011B depicted in FIG. 24 will now be referenced.

The photodiode 1111 included in the unit pixel 1011B receives incident light 1501 that enters from the back surface of the semiconductor substrate (the upper surface in FIG. 24). A flattened film 1513, a color film (CF) 1512, and a microlens 1511 are disposed above the photodiode 1111. In the photodiode 1111, the incident light 1501, which enters sequentially through various sections, is received by a light-receiving surface 1517 and subjected to photoelectric conversion.

For example, the photodiode 1111 is configured so that an n-type semiconductor region 1520 is formed as a charge storage region for storing electric charge (electrons). In the photodiode 1111, the n-type semiconductor region 1520 is disposed in p-type semiconductor regions 1516 and 1541 of a semiconductor substrate 1518. As regards the n-type semiconductor region 1520, the p-type semiconductor region 1541, which is disposed on the front surface (lower surface) of the semiconductor substrate 1518, is higher in impurity concentration than the p-type semiconductor region disposed on the back surface (upper surface). That is, the photodiode 1111 has an HAD (hole-accumulation diode) structure such that the p-type semiconductor regions 1516 and 1541 are formed to generate a dark current at each interface of the upper and lower surfaces of the n-type semiconductor region 1520.

A trench 1530 is disposed in the semiconductor substrate 1518 in order to provide electrical isolation between a plurality of unit pixels 1011B. The photodiode 1111 is disposed in a region partitioned by the trench 1530. In a case where the unit pixel 1011B depicted in FIG. 24 is viewed from the upper surface, the trench 1530 is formed, for example, in a grid pattern such that it is positioned between the plurality of unit pixels 1011B. The photodiode 1111 is formed in a region partitioned by the trench 1530. Further, the inside of the trench 1530 is filled with an insulating substance.

Each photodiode 1111 is configured so that its anode is grounded. In the unit pixel 1011B, therefore, a signal charge (e.g., electrons) stored by the photodiode 1111 is read out, for example, through the transfer transistor 112, and outputted, as an electrical signal, to the vertical signal line 1121 (FIG. 22).

A wiring layer 1550 is disposed on the front surface (lower surface) of the semiconductor substrate 1518, which is opposite the back surface (upper surface) on which, for example, a light-shielding film 1514, the CF 1512, and the microlens 1511 are disposed.

The wiring layer 1550 includes a wiring 1551 and an insulating layer 1552, and is formed so that the wiring 1551 is electrically connected to various elements in the insulating layer 1552. The wiring layer 1550 is a so-called multilayer wiring layer and formed in such a manner that the wiring 1551 and an interlayer insulating film included in the insulating layer 1552 are alternately stacked multiple times. Here, the wiring 1551 is configured so that, for example, wires to the transfer transistor and other transistors for reading electric charge from the photodiode 1111 and a wire to the vertical signal line 1121 are stacked through the insulating layer 1552.

A support substrate 1561 is disposed on a surface of the wiring layer 1550 that is opposite the surface on which the photodiode 1111 is disposed. For example, a substrate including a silicon semiconductor having a thickness of several hundred micrometers is disposed as the support substrate 1561.

The light-shielding film 1519 is disposed on the back surface (the upper surface in FIG. 24) of the semiconductor substrate 1518 and above the trench 1530. An STI (shallow trench isolation) 1531 is disposed beneath the trench 1530.

The light-shielding film 1514 is configured so as to shield part of the incident light 1501 that travels from above the semiconductor substrate 1518 toward its lower back surface.

The light-shielding film 1514 is disposed above the trench 1530, which is disposed in the semiconductor substrate 1518. Here, the light-shielding film 1514, which is disposed on the back surface (upper surface) of the semiconductor substrate 1518, protrudes in a convex shape through an insulating film 1515 such as a silicon oxide film. Conversely, the light-shielding film 1514 is not disposed above the photodiode 1111 in the semiconductor substrate 1518 so that the incident light 1501 fails on the photodiode 1111 through an opening.

That is, in a case where the unit pixel 1011B depicted in FIG. 24 is viewed from the upper surface, the plane surface of the light-shielding film 1514 is shaped like a grid so as to form an opening for allowing the incident light 1501 to fall on the light-receiving surface 1517.

The light-shielding film 1514 is formed by a light-shielding material that blocks light. The light-shielding film 1514 is formed, for example, by sequentially stacking a titanium (Ti) film and a tungsten (W) film. Alternatively, the light-shielding film 1514 may be formed by sequentially stacking, for example, a titanium nitride (TiN) film and a tungsten (W) film. Further, the light-shielding film 1514 may be coated, for example, with nitride (N).

The light-shielding film 1514 is coated with the flattened film 1513. The flattened film 1513 is formed by using an insulating material that transmits light.

The selection transistor 115 and the amplifying transistor 1114 are formed in the wiring layer 1550. It is assumed that the amplifying transistor 1114 has a configuration to which the above-described transistor 100 is applied and includes a buried drain region.

The source 1114-2 and drain 1114-3 (buried drain region) of the amplifying transistor 1114 are formed in the p-type semiconductor region 1541, and the gate 1114-1 of the amplifying transistor 1114 is formed in the wiring layer 1550. As described above, the transistor according to the present technology is applicable to a transistor configuring a pixel, that is, an amplifying transistor in the present example.

Applying the present technology improves the noise characteristics of the amplifying transistor 1114 and the on-resistance of the reset transistor 1113 and selection transistor 1115.

In the unit pixel 1011A including three transistors and the unit pixel 1011B including four transistors, which have been described above, an analog operation is performed by allowing the transfer transistor 1112 to transfer the signal charge, which is obtained from photoelectric conversion in the photodiode 1111, to the FD section 1116 and permitting the amplifying transistor 1114 to amplify a potential corresponding to the signal charge in the FD section 1116 and output the amplified potential to the vertical signal line 1121. In a pixel circuit performing such an analog operation, a threshold voltage Vth varies due to short-channel effects if the transistors including the amplifying transistor 1114 have a small channel length. Therefore, MOS transistors having a great channel length are used as the transistors including the amplifying transistor 1114.

As regards the unit pixel 1011 (1011A/1011B) having the above-described configuration, the present technology is characterized in that a buried-channel MOS transistor, for example, an N-channel MOS transistor (hereinafter referred to as the NMOS transistor) in the present example, is used as the amplifying transistor 1114. Here, when the NMOS transistor is used as the amplifying transistor 1114, the N-type acts as a first conductivity type, whereas the P-type acts as a second conductivity type.

The present technology is applicable to the above-described transistor.

In this document, the term "system" denotes the whole set of apparatuses.

It should be noted that the advantages described in this document are merely illustrative and not restrictive. The present technology can provide additional advantages.

It should be noted that the embodiments according to the present technology are not limited to the above-described ones. It is to be understood that the embodiments may be variously modified and changed without departing from the spirit and scope of the present technology.

It should be noted that the present technology may also adopt the following configurations.

(1) A transistor including:
a gate electrode that is formed on a semiconductor substrate;
a source region that is formed on a surface of the semiconductor substrate and extended from the gate electrode; and a drain region that is positioned to oppose the source region and formed on the surface of the semiconductor substrate without being brought into contact with the gate electrode.

(2) The transistor according to (1) above, in which the source region and the drain region are asymmetrical.

(3) The transistor according to (1) or (2) above, in which the drain region is formed at a position deeper than the source region.

(4) The transistor according to any one of (1) to (3) above, in which
the source region, the gate electrode, and the drain region are linearly arranged, (5) The transistor according to any one of (1) to (3) above, in which
the source region, the gate electrode, and a portion of the drain region that is formed at a position deeper than the source region are linearly arranged.

(6) The transistor according to (5) above, in which the drain region formed at a position deeper than the source region has a width of 5 to 20 nm.

(7) The transistor according to any one of (2) to (6) above, in which
the drain region formed at a position deeper than the source region has a concentration of 1e19 cm$^{-3}$ or higher.

(8) The transistor according to any one of (1) to (7) above, in which
at a gate end of the gate electrode, the drain region is formed at a distance from the surface of the semiconductor substrate.

(9) The transistor according to any one of (1) to (8) above, in which
the drain region is formed on a recessed portion.

(10) The transistor according to any one of (1) to (9) above, in which
a distance between the drain region and the gate end of the gate electrode is set so as to form a channel at a position away from the surface of the semiconductor substrate and continuously without being interrupted by an electric field of a drain.

(11) The transistor according to any one of (1) to (10) above, in which
an amount of protrusion of the drain region from the gate end of the gate electrode is set in consideration of preventing short-circuiting to the source region, gate length, avoiding channel shortening, and implantation alignment.

(12) The transistor according to any one of (1) to (11) above, in which
a width of a high-resistance region of the drain region is set to form a channel at a position away from the surface of the semiconductor substrate and continuously without being interrupted by the electric field of the drain.

(13) The transistor according to any one of (1) to (12) above, in which
the distance between the drain region and the gate end of the gate electrode is between 0 and 0.3 μm.

(14) The transistor according to any one of (1) to (13) above, in which
the amount of protrusion of the drain region from the gate end of the gate electrode is within ±0.1 μm.

(15) The transistor according to any one of (1) to (14) above, in which
the width of the high-resistance region of the drain region is between 0 and 0.3 μm.

(16) A manufacturing method for manufacturing a transistor, the transistor including:
a gate electrode that is formed on a semiconductor substrate;
a source region that is formed on a surface of the semiconductor substrate and extended from the gate electrode; and
a drain region that is positioned to oppose the source region and formed on the surface of the semiconductor substrate without being brought into contact with the gate electrode.

(17) The manufacturing method according to (16) above including:
forming the drain region by performing resist patterning and ion implantation twice.

(18) The manufacturing method according to (16) above including:
forming the drain region by performing resist patterning and ion implantation and performing resist patterning and ion implantation for canceling conductivity of a portion coming into contact with the gate electrode.

(19) The manufacturing method according to (16) above including:
forming the drain region by performing resist patterning and ion implantation after formation of a recessed portion.

(20) The manufacturing method according to (16) above including:
forming the drain region by forming a recessed portion after performing resist patterning and ion implantation.

REFERENCE SIGNS LIST

100: Transistor, 121: Semiconductor substrate, 122: Source, 123: Drain, 124: Gate, 125 and 126: Gate end, 500: Transistor, 501: Drain

The invention claimed is:

1. A transistor comprising:
a gate electrode formed on a semiconductor substrate;
a source region formed on a surface of the semiconductor substrate and extended from the gate electrode; and
a drain region that is positioned to oppose the source region and formed on the surface of the semiconductor substrate without being brought into contact with the gate electrode, wherein the source region and the drain region are asymmetrical, wherein the drain region is formed in an L-shaped configuration denoting a two-directional arrangement, wherein the drain region is divided into an upper portion and a lower portion, wherein a top surface of the upper portion is coplanar with the surface of the semiconductor substrate and the lower portion is at a distance from the surface of the semiconductor substrate overlapped by the gate electrode, wherein in a cross-sectional view the lower portion extends towards the source region, and wherein a channel is formed between the source region and the drain region in such a manner that the channel deepens as it goes from the source region to the drain region.

2. The transistor according to claim 1, wherein the source region, the gate electrode, and the drain region are linearly arranged.

3. The transistor according to claim 1, wherein the source region, the gate electrode, and a portion of the drain region that is formed at a position deeper than the source region are linearly arranged.

4. The transistor according to claim 3, wherein the portion of the drain region formed at the position deeper than the source region has a width of 5 to 20 nm.

5. The transistor according to claim 3, wherein the portion of the drain region formed at a position deeper than the source region has a concentration of 1e19 cm$^{-3}$ or higher.

6. The transistor according to claim 1, wherein at a gate end of the gate electrode, the drain region is formed at a distance from the surface of the semiconductor substrate.

7. The transistor according to claim 1, wherein the drain region is formed on a recessed portion.

8. The transistor according to claim 1, wherein a distance between the drain region and a gate end of the gate electrode is set so as to form the channel at a position away from the surface of the semiconductor substrate and continuously without being interrupted by an electric field of a drain.

9. The transistor according to claim 1, wherein an amount of protrusion of the drain region from a gate end of the gate electrode is set in consideration of preventing short-circuiting to the source region, gate length, avoiding channel shortening, and implantation alignment.

10. The transistor according to claim 1, wherein a width of a high-resistance region of the drain region is set to form the channel at a position away from the surface of the semiconductor substrate and continuously without being interrupted by an electric field of a drain.

11. The transistor according to claim 1, wherein a distance between the drain region and a gate end of the gate electrode is between 0 and 0.3 µm.

12. The transistor according to claim 1, wherein an amount of protrusion of the drain region from a gate end of the gate electrode is within ±0.1 µm.

13. The transistor according to claim 10, wherein the width of the high-resistance region of the drain region is between 0 and 0.3 µm.

14. A manufacturing method for manufacturing a transistor including:
forming a gate electrode on a semiconductor substrate;
forming a source region on a surface of the semiconductor substrate, wherein the source region extends from the gate electrode; and
forming and positioning a drain region to oppose the source region on the surface of the semiconductor substrate without being brought into contact with the gate electrode, wherein the source region and the drain region are asymmetrical, wherein the drain region is formed in an L-shaped configuration denoting a two-directional arrangement, wherein the drain region is divided into an upper portion and a lower portion, wherein a top surface of the upper portion is coplanar with the surface of the semiconductor substrate and the lower portion is at a distance from the surface of the semiconductor substrate overlapped by the gate electrode, wherein in a cross-sectional view the lower portion extends towards the source region, and wherein a channel is formed between the source region and the drain region in such a manner that the channel deepens as it goes from the source region to the drain region.

15. The manufacturing method according to claim 14, comprising:
forming the drain region by performing resist patterning and ion implantation twice.

16. The manufacturing method according to claim 14, comprising:
forming the drain region by performing resist patterning and ion implantation for canceling conductivity of a portion of the drain region coming into contact with the gate electrode.

17. The manufacturing method according to claim 14, comprising:
forming the drain region by performing resist patterning and ion implantation after formation of a recessed portion.

18. The manufacturing method according to claim 14, comprising:
forming the drain region by forming a recessed portion after performing resist patterning and ion implantation.

* * * * *